United States Patent
Mori et al.

(10) Patent No.: US 7,420,259 B2
(45) Date of Patent: *Sep. 2, 2008

(54) SEMICONDUCTOR DEVICE HAVING TWO-LAYERED CHARGE STORAGE ELECTRODE

(75) Inventors: Seiichi Mori, Tokyo (JP); Mitsuhiro Noguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

This patent is subject to a terminal disclaimer.

(21) Appl. No.: 11/373,982

(22) Filed: Mar. 14, 2006

(65) Prior Publication Data

US 2006/0163637 A1 Jul. 27, 2006

Related U.S. Application Data

(60) Continuation of application No. 10/869,392, filed on Jun. 17, 2004, now Pat. No. 7,061,069, which is a division of application No. 10/728,818, filed on Dec. 8, 2003, now Pat. No. 6,806,132, which is a division of application No. 09/984,599, filed on Oct. 30, 2001, now Pat. No. 6,713,834.

(30) Foreign Application Priority Data

Oct. 30, 2000 (JP) ............................ P2000-331407
Oct. 22, 2001 (JP) ............................ P2001-324141

(51) Int. Cl.
*H01L 29/00* (2006.01)
*H01L 21/762* (2006.01)

(52) U.S. Cl. .............................. 257/510; 257/E21.548; 438/427

(58) Field of Classification Search ................ 257/301, 257/E27.092, 501, 510, E21.548; 438/427
See application file for complete search history.

(56) References Cited

U.S. PATENT DOCUMENTS

| 6,153,494 | A | 11/2000 | Hsieh et al. |
| 6,171,909 | B1 | 1/2001 | Ding et al. |
| 6,310,374 | B1 | 10/2001 | Satoh et al. |
| 6,342,715 | B1 * | 1/2002 | Shimizu et al. ............. 257/314 |
| 6,391,722 | B1 | 5/2002 | Koh |
| 6,479,858 | B2 | 11/2002 | Krivokapic |

FOREIGN PATENT DOCUMENTS

| JP | 11-87543 | | 3/1999 |
| JP | 11163304 A | * | 6/1999 |
| JP | H11-261038 | | 9/1999 |
| JP | H10-335497 | | 12/1999 |
| JP | 2000-232169 | | 8/2000 |

* cited by examiner

*Primary Examiner*—David Vu
*Assistant Examiner*—Earl N Taylor
(74) *Attorney, Agent, or Firm*—Oblon, Spivak, McClelland, Maier & Neustadt, P.C.

(57) ABSTRACT

A first insulation film, a first conductor film, and a cap are sequentially formed on a semiconductor substrate. The first insulation film, the first conductor film, and the cap, and the substrate are etched in the same pattern. A second insulation film is placed in that etched pattern. The cap is removed. A second conductor film is formed on the side face of the second insulation film.

17 Claims, 22 Drawing Sheets

SEMICONDUCTOR DEVICE HAVING TWO-LAYERED CHARGE STORAGE ELECTRODE

CROSS REFERENCE TO RELATED APPLICATIONS

This application is a continuation of and claims benefit under 35 U.S.C. §120 from U.S. application Ser. No. 10/869,392, filed Jun. 17, 2004, which is a division of U.S. application Ser. No. 10/728,818, filed Dec. 8, 2003, which is a division of U.S. Pat. No. 6,713,834, which issued Mar. 30, 2004 and is based upon and claims the benefit of priority from prior Japanese Patent Applications P2000-331407 and P2001-324141 filed on Oct. 30, 2000 and Oct. 22, 2001; the entire contents of which are incorporated by reference herein.

BACKGROUND OF THE INVENTION

The present invention relates to a semiconductor device having trench-type isolation regions, a floating gate, and a control gate. More particularly, the present invention relates to capacitive coupling between a floating gate and a control gate.

A nonvolatile semiconductor storage device is composed of nonvolatile memory cells. These nonvolatile memory cells each have a floating gate and a control gate. Potential of the floating gate is controlled by capacitive coupling between the floating gate and the control gate. As the capacitive coupling between the control gate and the floating gate increases, the voltage of the control gate can be lowered. In order to increase the capacitive coupling, the area where the control gate is proximal to the floating gate is increased as follows. The floating gate has a two-layered structure made of a polycrystalline silicon (Si) film in the first layer and polycrystalline silicon at a second layer. The polycrystalline silicon film of the first layer is formed by self-alignment with trench-type isolation regions. The polycrystalline silicon film of the second layer is formed onto the polycrystalline silicon film of the first layer and the trench type isolation regions. An insulation film is formed onto the polycrystalline silicon of the second layer. A control gate is formed onto this insulation film.

However, this cell structure requires a space, an isolation width "Wt" of the memory cell, for separating the polycrystalline silicon of the second layers. In addition, this cell structure requires a space, as an alignment margin, during lithography steps.

In this cell structure, in order to increase the capacitive coupling between the floating gate and the control gate, it is effective to increase the film thickness of the floating gate. When the film thickness of the floating gate is increased, capacitive coupling C2 in the floating gate between cells increases. When the capacitive coupling C2 increases, the cell threshold voltage is susceptible to modulation corresponding to the state of data in adjacent cells.

SUMMARY OF THE INVENTION

A semiconductor device in accordance with embodiments of the present invention includes a semiconductor substrate including plural trenches on a surface, first and second insulators placed in the trench and upper portions of side faces of the first and second insulators are higher than the surface of the substrate, a third insulation film disposed on the surface of the substrate, one end of the third insulation film contacts with the first insulator, and the other end of the third insulation film contacts with the second insulator, a first conductor disposed on a surface of the third insulation film, one end face of the first conductor contacts with the first insulator, and the other end face of the first conductor contacts with the second insulator, a second conductor disposed at a vicinity of the one end face of the first conductor, a third conductor disposed at a vicinity of the other end face of the first conductor, a fourth insulation film contacting with a first side face of the second conductor and a second side face of the third conductor and contacting with a top face of the first conductor, and a fourth conductor disposed on the fourth insulation film.

BRIEF DESCRIPTION OF THE DRAWINGS

FIG. 16A to FIG. 20D is sectional views each showing a semiconductor device in accordance with the fourth embodiment by manufacturing process.

FIG. 16A, FIG. 16C, FIG. 17A, FIG. 17C, FIG. 18A, FIG. 18C, FIG. 19A, FIG. 19C, FIG. 20A and FIG. 20C are sectional views each showing a memory cell region.

FIG. 16B, FIG. 16D, FIG. 17B, FIG. 17D, FIG. 18B, FIG. 18D, FIG. 19B, FIG. 19D, FIG. 20B, and FIG. 20D are sectional views each showing a peripheral circuit region.

FIG. 21A is a sectional view taken along line I-I in FIG. 21C. FIG. 21B is a sectional view taken along line VI-VI in FIG. 21C.

FIG. 23A and FIG. 23C are sectional views each showing a memory cell region; and FIG. 23B and FIG. 23D are sectional views each showing a peripheral circuit region.

DETAILED DESCRIPTION OF EMBODIMENTS

Figure 1A:
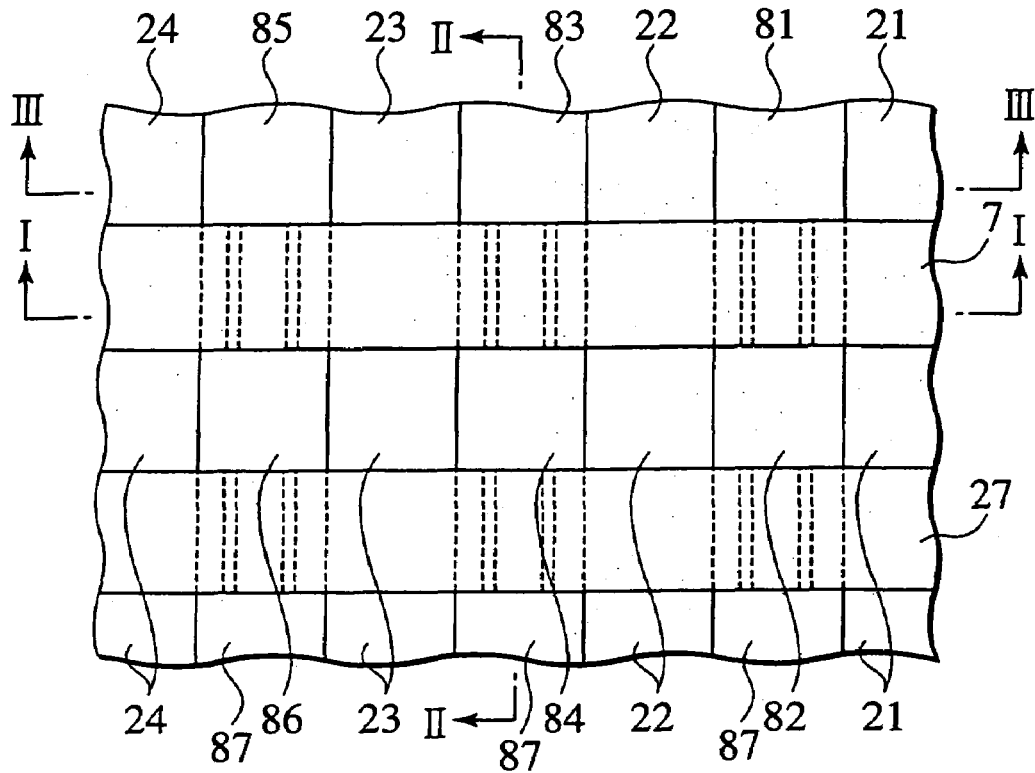
FIG. 1A is a top view showing a semiconductor device in accordance with a first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

A semiconductor device in accordance with a first embodiment of the present invention has the following features, as shown in FIG. 1A to FIG. 2B. A semiconductor substrate 1 has plural trenches on a surface. Isolation regions 21 to 24 are placed in the trenches. Side faces of the isolation regions 21 to 24 each extend to a position that is higher than a surface of the substrate 1. Tunnel oxide films 31 to 33 are provided on the surface of the substrate 1. Both ends of the tunnel oxide films 31 to 33 each come into contact with the isolation regions 21 to 24.

First conductors 41 to 43 are provided on the surface of the tunnel oxide films 31 to 33. Both end faces of the first conductors 41 to 43 come into contact with the isolation regions 21 to 24. Second conductors 51, 53, and 55 are provided in the vicinity of one end face of the first conductor. First side faces of the conductors 51, 53, and 55 come into contact with the isolation regions 21 to 24. Third conductors 52, 54, and 56 are provided on the surfaces of the first conductors 41 to 43. The third conductors 52, 54, and 56 are provided in the vicinity of the other end face of the first conductor. First side faces of the third conductors 52, 54, and 56 each come into contact with the isolation regions 21 to 24. The floating gate is composed of: the first conductors 41 to 43; the second conductors 51, 53, and 55; and the third conductors 52, 54, and 56.

An insulation film 6 comes into contact with a second side face of each of the second conductors 51, 53, and 55. The insulation film 6 comes into contact with the first side face of each of the third conductors 52, 54, and 56. The insulation film 6 comes into contact with the surface of each of the first conductors 41 to 43. An conductor that is a control gate 7 is provided on the insulation film 6.

In the following embodiments, a charge storage region that is an electrode responsible for charge storage is expressed as a floating gate electrode as usual. The floating gate electrode can hold a charge during a hold time in accordance with use, for example, for 10 years for nonvolatile memory use, and for about 1 second for nonvolatile memory use.

Source/drain regions 81 to 87 are disposed in the vicinity of the surface of the semiconductor substrate 1. The conductor type of the source/drain regions 81 to 87 differs from that of the substrate 1 below the floating gate electrodes 41 to 43. Further, as shown in FIG. 1A, a plurality of trench type isolation regions 21 to 24 are disposed in parallel in a longitudinal direction, and a plurality of control gates 7 and 27 are disposed in parallel in a transverse direction, whereby a number of nonvolatile memory cells can be integrated on the substrate 1.

A floating gate electrode is structured in two-layered manner. The first layer corresponds to first conductors 41 to 43. The second layer corresponds to second and third conductors 51 to 56. The second and third conductors are electrically connected to the first conductors. The first to third conductors 42, 53, and 54 serve as one floating gate electrode.

The pattern of the trench type isolation regions 21 to 24 is an inverted pattern of that of the first conductors 41 to 43. The first conductors 41 to 43 are separated by self-alignment in accordance with the trench type isolation regions 21 to 24. The second and third conductors 51 to 56 are provided on the side faces of the isolation insulation films 21 to 24, on the ends of the first conductors 41 to 43, as sidewalls of the isolation insulation films 21 to 24. The side faces of the second and third conductors 51 to 56 are disposed under the control gate 7 and adjacent to the protrusive portions.

A flash memory cell that is a nonvolatile memory cell has floating gates 42, 53, and 54 and a control gate 7. When the fined flash memory cells is developed, it is necessary to maintain the size of capacitive coupling between each of the floating gates 42, 53, and 54 and the control gate 7. In accordance with the first embodiment, the amount of capacitive coupling between the control gate 7 and each of the floating gates 42, 53, and 54 can be increased. Thereby improving the performance of the memory cells. There are two reasons for this higher density and increase in capacitance being achievable. The first reason is that an active region and a first conductor 42 are provided to the trench isolation regions 22 and 23 in a self-aligned manner. The second reason is that the second and third conductors 53 and 54 that form the side walls of the trench type isolation regions 22 and 23 are provided to both ends of the first conductor 42, i.e., the side faces of the trench type isolation regions 22 and 23. An increased density can be achieved by the multiple self-alignment structure. The side face areas of the second and third conductors 53 and 54 can be increased, thus increasing capacitive coupling.

The side face of the second conductor 51 comes into contact with the first isolation region 21. The side face of the third conductor 52 comes into contact with the second isolation region 22. This contact between the conductors 51 and 52 and the isolation regions 21 and 22 is formed in a self-aligned manner.

Figure 2A:
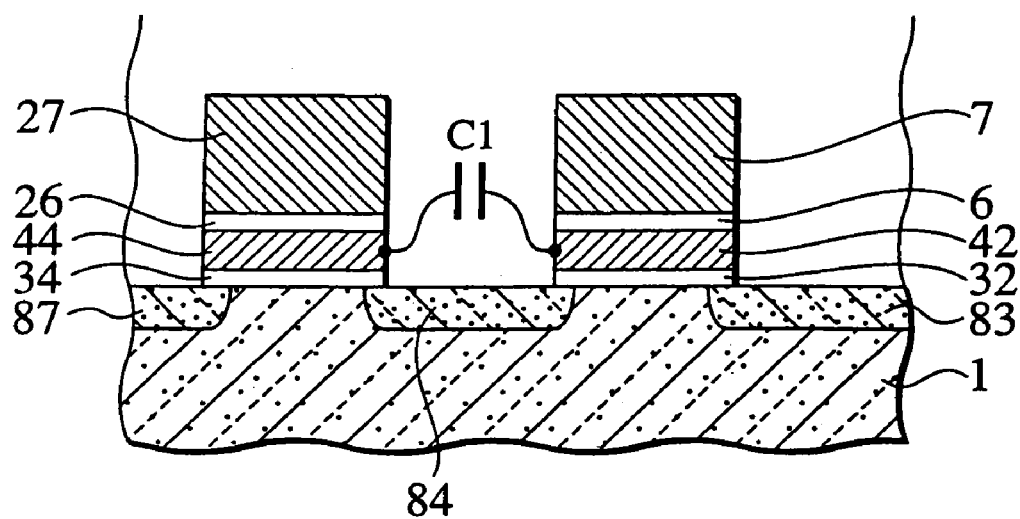
FIG. 2A is a sectional view taken along line II-II in FIG. 1A.
Figure 10:
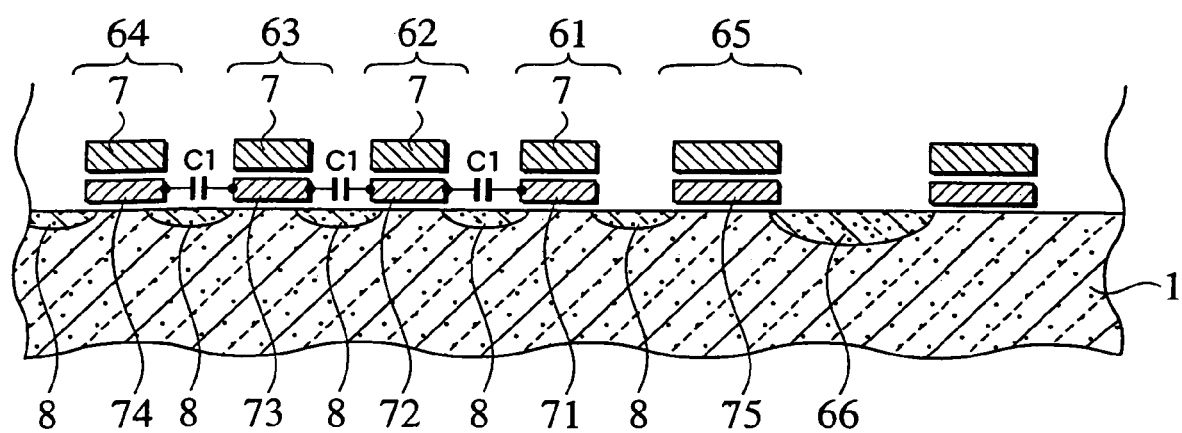
FIG. 10 is a view illustrating an effect of capacitive coupling reduction in floating gate obtained by the semiconductor device in accordance with the first and second embodiments.

In addition, as shown in FIG. 2A and FIG. 10, the film thickness of the first conductors 42 and 44 or 71 to 74 is relatively thin. In addition, the film thicknesses of the second and third conductors 53 and 54 are also thin. Due to this, the parasitic capacity C1 among floating gate electrodes in the adjacent cells 61 to 64 can be reduced. Then, threshold voltage interference caused between cells via the parasitic capacity C1 can be reduced.

Hereinafter, a method of manufacturing a semiconductor device in accordance with a first embodiment will be described.

Figure 3A:
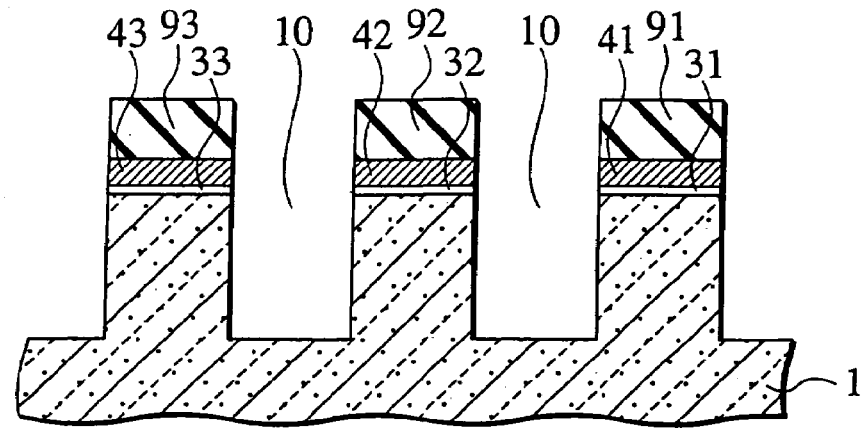
FIG. 3A to FIG. 4B are sectional views each showing a semiconductor device in accordance with the first embodiment by manufacturing process.

(1) First, as shown in FIG. 3A, a trench section 10 is formed in place of the isolation regions 22 and 23. The trench section 10 and the first conductors 41 to 43 and active region 1 are processed in a self-aligned manner. The first conductors 41 to 43 are not arranged laterally along the active region 1.

Insulation films 31 to 33 are silicon oxide films or silicon oxynitride films are formed on a p-type silicon (Si) substrate 1. These silicon oxide films or silicon oxynitride films act as tunnel oxide films of nonvolatile memory cells. The film thicknesses of these silicon oxide films are within a range of 3 nm to 15 nm. The film thicknesses of these silicon oxide films are for example about 10 nm. First conductors 41 to 43 are polycrystalline silicon (Si) films deposited on the insulation films 31 to 33. The film thicknesses of the first conductors 41 to 43 are with in a range of 10 nm to 500 nm. The film thicknesses of the first conductors 41 to 43 are for example about 30 nm. Caps 91 to 93 that silicon nitride films deposited above the first conductors 41 to 43. The film thicknesses of the caps 91 to 93 are within a range of 3 nm to 500 nm. The film thicknesses of the caps 91 to 93 are for example about 100 nm. The heights of the second and third conductors 51 to 56 correspond to the film thicknesses of the caps 91 to 93, and are substantially equal to each other. That is, as the film thicknesses of the caps 91 to 93 increases, the heights of the second and third conductors 51 to 56 are also increased.

Now, trenches 10 are grooved in each of the regions that are referred to as the isolation regions 21 to 24 by lithography steps and etching. Specifically, the caps 91 to 93, first conductors 31 to 33, and silicon substrate 1 are sequentially etched. The isolation trenches 10, first conductors 41 to 43, and caps 91 to 93 are formed in a self-aligned manner. The depth of trenches 10 in the silicon substrate 1 is within a range of 50 nm to 1000 nm. The depth of trenches 10 in the silicon substrate 1 is for example about 300 nm. After grooving trenches 10, a thin silicon oxide film is formed as required in accordance with a thermal oxidization technique. The film thickness of this silicon oxide film is within a range of 3 nm to 20 nm. The film thickness of this silicon oxide film is for example about 10 nm.

In this manner, cell minuteness has been enhanced. In addition, the first conductors 41 to 43 are not formed so as to cover the corner portions of the active region. Electric field concentration at the corner portion of the active region does not occur. Deviation in memory cell characteristics due to this electric field concentration can thereby be suppressed.

Figure 3B:
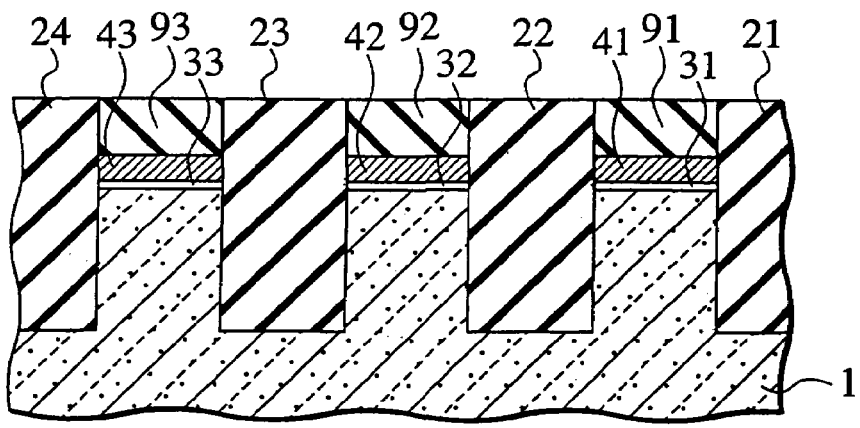

(2) Next, each of the isolation regions 21 to 24 is placed up with an insulation film in accordance with an HDP (High Density Plasma Deposition) technique. As shown in FIG. 3B, after depositing this insulation film, insulation films 21 to 24 are polished down to the top faces of the caps 91 to 93 in accordance with a method such as CMP (Chemical Mechanical Polishing). The insulation films 21 to 24 are flattened. The isolation regions 21 to 24 are each filled up to the end of the first conductor in a self-alignment manner.

Figure 3C:
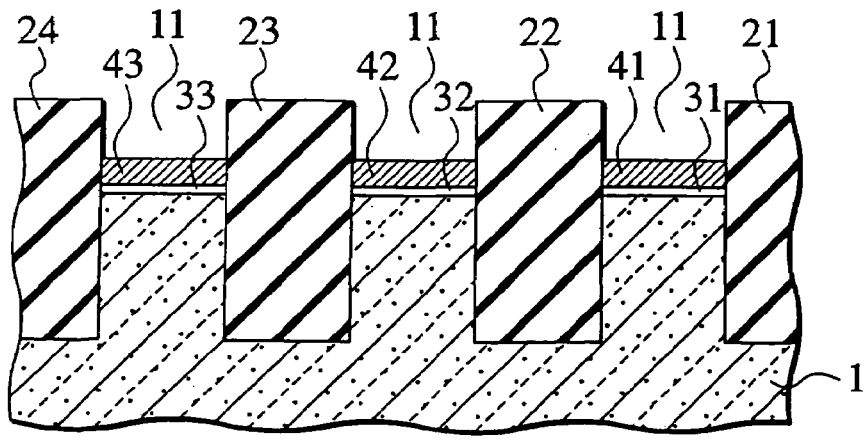

(3) As shown in FIG. 3C, caps 91 to 93 are removed. This produces trench portions 11 surrounded by the isolation regions 21 to 24. If the caps 91 to 93 are silicon nitride films, a chemical solution made of a heated (hot) phosphate ($H_3PO_4$) is used. Only the caps 91 to 93 can be easily removed by etching, using this chemical solution.

Figure 4A:
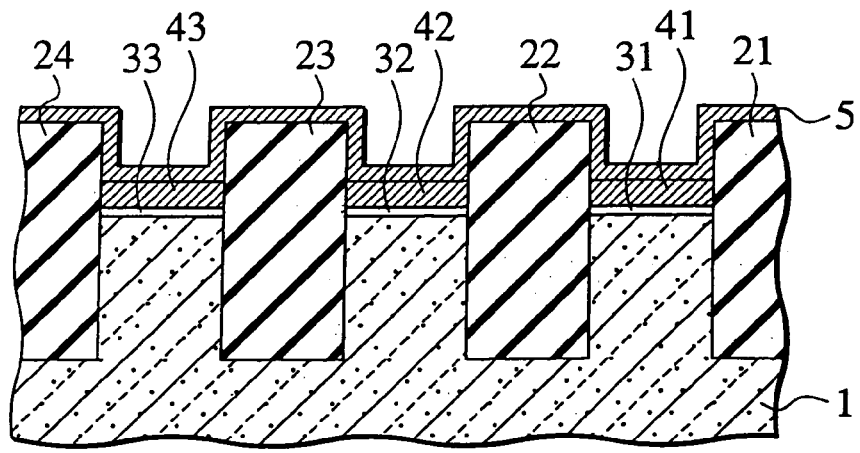
FIG. 4C is a sectional view taken along line I-I in FIG. 5.

(4) As shown in FIG. 4A, a thin conductor film 5 is deposited on the exposed faces of each of the isolation regions 21 to 24. This thin conductor film 5 is made of a polycrystalline silicon. This thin conductor film 5 is used to form the second and third conductors 51 to 56.

Figure 4B:
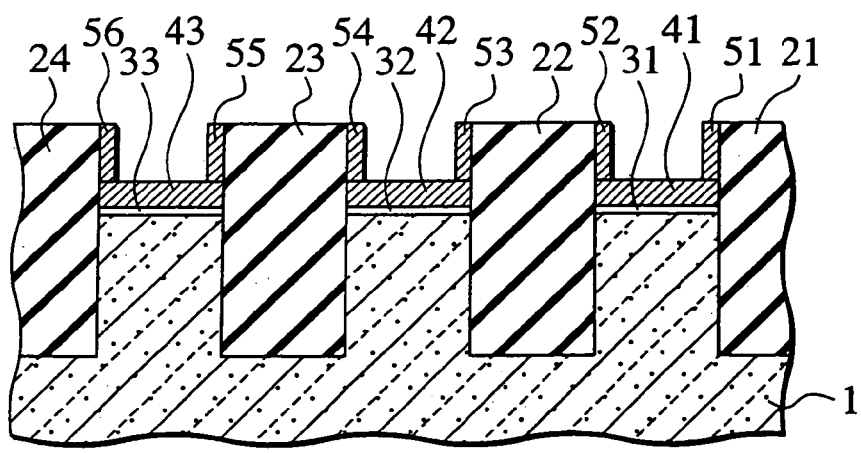

(5) As shown in FIG. 4B, the conductor film 5 is etched back. The second and third conductors 51 to 56 are formed on the side faces of the isolation regions 21 to 24. In this etching back process, the insulator film 5 formed on each of the isolation regions 21 to 24 that exist between cells is removed in a self-aligned manner. The second and third conductors 51 to 56 can be separated into cells. For example, the second conductor 53 and the third conductor 52 are separated from each other. The first conductors 41 to 43 and the second and third conductors 51 to 56 are electrically connected with each other on the bottom faces of the conductors 51 to 56. Even if a thin insulation film exists between the first and second conductors 41 and 51, the first and second conductors 41 and 51 are still capacitively-coupled with each other. Therefore, even in the case where an insulation film exists, the memory cell operates in the same way as it would were it electrically connected.

Figure 4C:
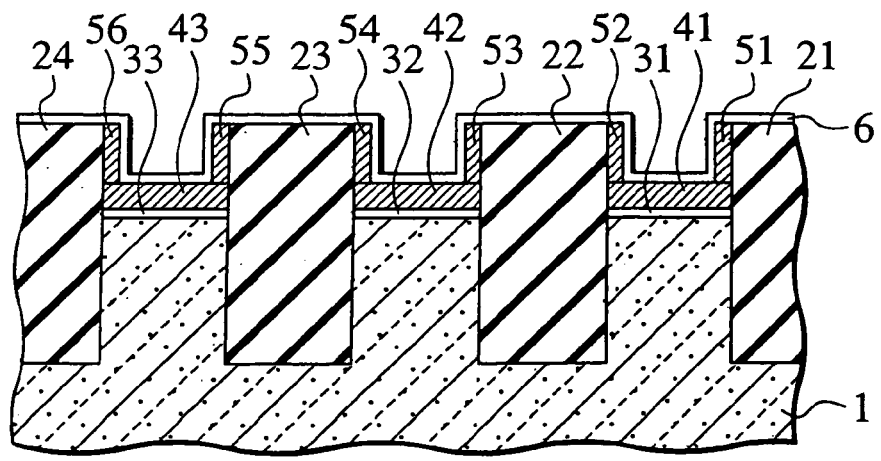
Figure 5:
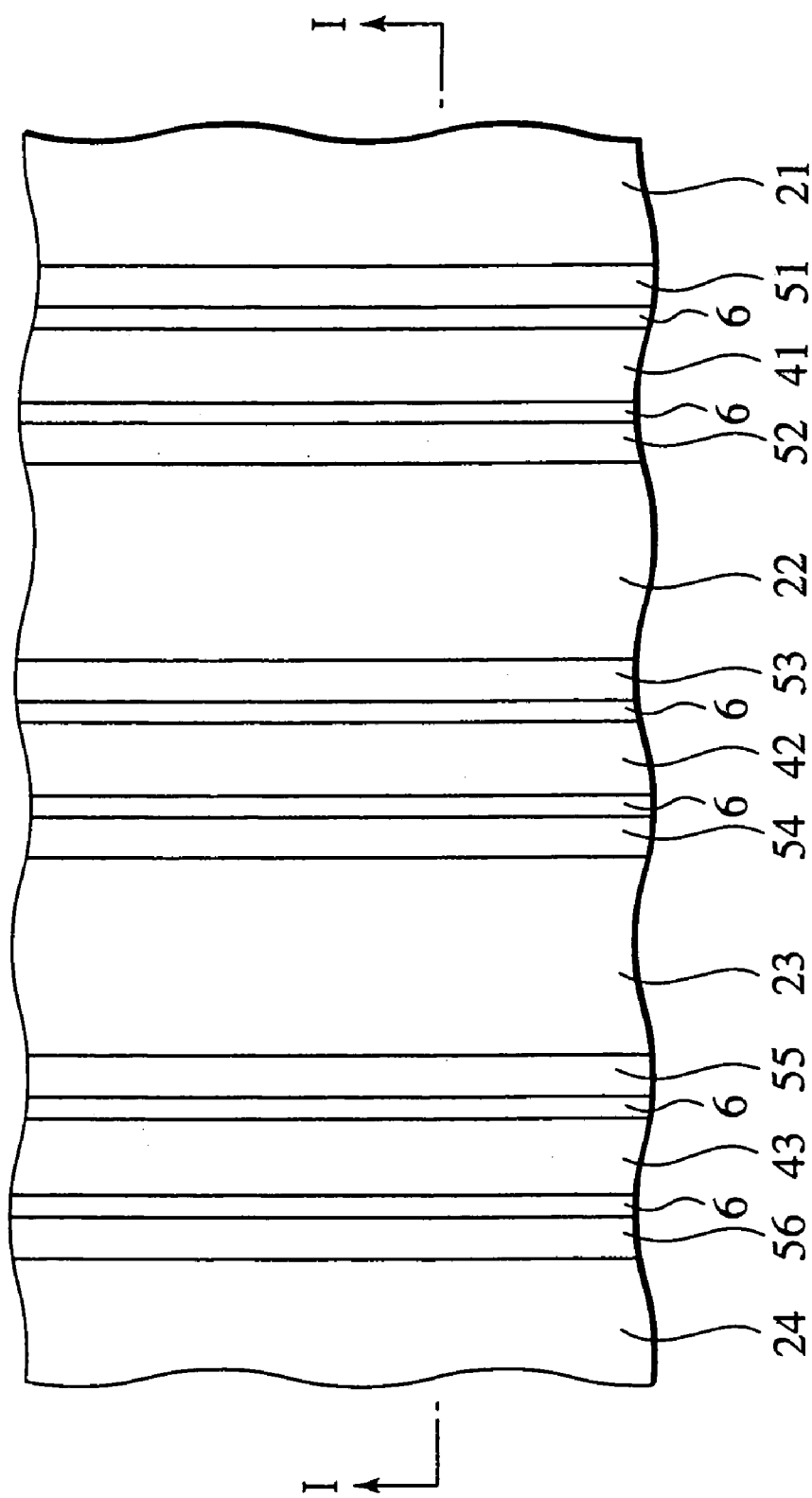
FIG. 5 is a upward perspective view showing a semiconductor device shown in FIG. 4C.

(6) As shown in FIG. 4C and FIG. 5, an insulation film 6 is formed between each of the floating gates 42, 53, and 54 and the control gate 7. The insulation film 6 is formed on the side face of each of the second and third conductors 51 to 56. The insulation film 6 is formed on the top face of each of the second and third conductors 51 to 56, first conductor, and isolation regions 21 to 24. The insulation film 6 is formed on the inner wall of the trench sections 11. For the insulation film 6, a three-layered structure made of a silicon oxide film, a silicon nitride film, and a silicon oxide film, a so-called ONO film is used.

Figure 1B:
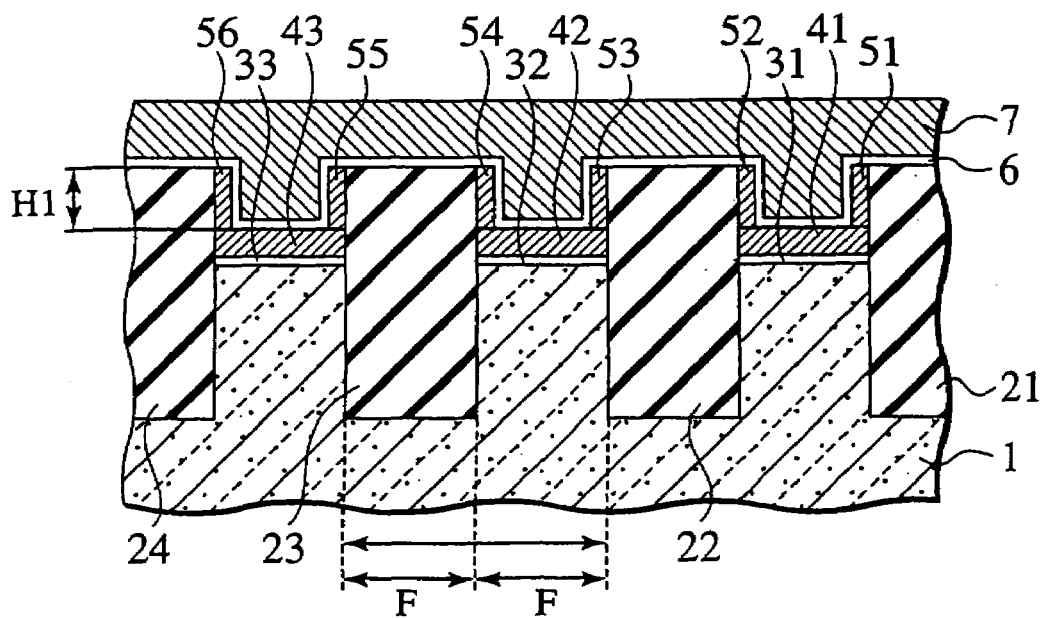
FIG. 1B is a sectional view taken along line I-I in FIG. 1A.

(7) As shown in FIG. 1B, the control gate 7 is deposited above the insulation film 6. The control gate 7 is filled up in a trench sections 11. The control gate 7 is deposited in proximity to the side face of each of the second and third conductors 51 to 56. The second and third conductors 51 to 56 and the control gate 7 each have a large coupling capacitance.

Figure 2B:
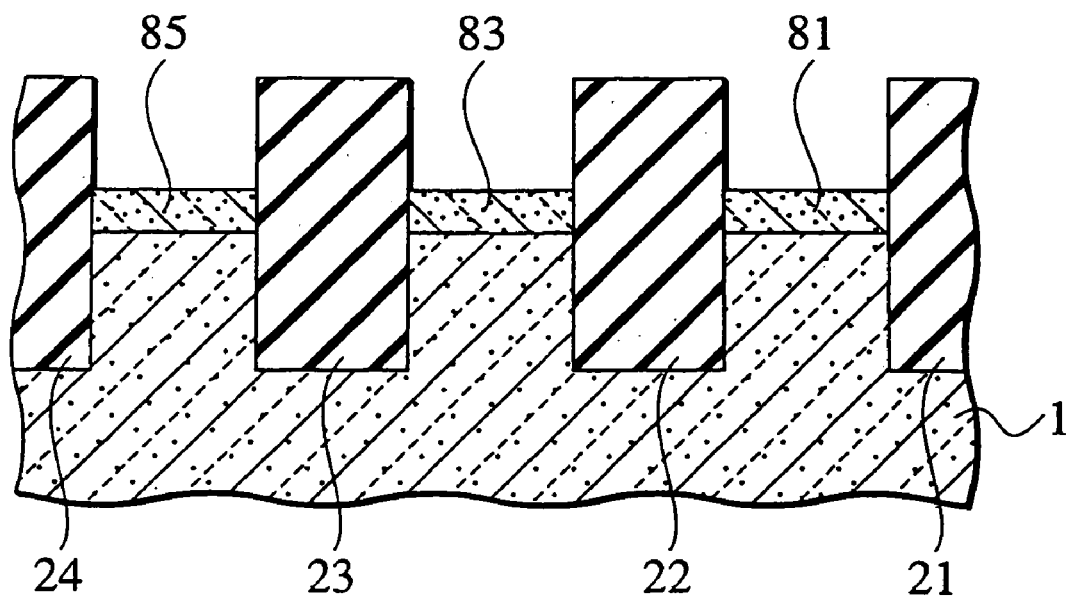
FIG. 2B is a sectional view taken along line III-III in FIG. 1A.

(8) As shown in FIG. 1A, the control gate materials 7 and 27 are formed in a striped shape by lithography steps and etching. This etching uses the same mask or the etched control gate materials 7 and 27 are used as masks. Further, the isolation regions 21 to 25 are used as masks, and the first to third conductors 42 and 44 and the like are etched as shown in FIG. 2A and FIG. 2B. In this etching, as shown in FIG. 1B, it is preferable that the control gate 7, the second and third conductors 56 and the like, and the insulation film 6 each having thickness H1 equal to each other are etched at the same etching-rates at the same time. In this etching, etching condition with high deposition rates of absorbates may be selected. In addition, a second modified example of the first embodiment as described later, may be employed. In this manner, even if etching rates are different from each other depending on the material, a good etching shape can be obtained.

Lastly, the isolation regions 21 to 24 or the control gate materials 7 and 27 are used as masks, and ion implantation is carried out for the substrate 1. The implanted impurities are activated. In this manner, source/drain regions 81 to 87 are formed.

In a manufacturing method in accordance with the first embodiment, lithography and etching steps are not required for separating a generally used floating gate. An alignment margin, i.e. overlay in an active region for the floating gates 41 to 43 is not required. The isolation regions 21 to 24 and the active region can be formed in a self-aligned manner. In this manner, cell-minuteness can be enhanced. As shown in FIG. 1B, the transverse width of a cell can be scaled down to be twice that of a minimum design dimension F. This is because the width and interval of the isolation region 23 and the like can be set to F, respectively. In a semiconductor integrated circuit using a high voltage, its isolation space can be reduced down to F. The chip area for this semiconductor integrated circuit can be reduced. Thereby, the manufacturing cost of this semiconductor integrated circuit can be reduced.

In addition, the second and third conductors 51 to 56 are formed to both ends of the first conductors 41 to 43, as sidewalls of the isolation regions 21 to 24 in a self-aligned manner. The film thickness of the first to third conductors can be decreased. Thus, the parasitic capacitance C1 between floating gate electrodes and the adjacent cells can be reduced. Thereby, reducing interference the threshold voltage between cells caused by this parasitic capacitance. In this way, the minuteness of the flash memory can be enhanced, while maintenance of the capacitive coupling between each of the floating gates 41 to 43 and the like and the control gate 7 is achieved.

First Modified Example of First Embodiment

Figure 6:
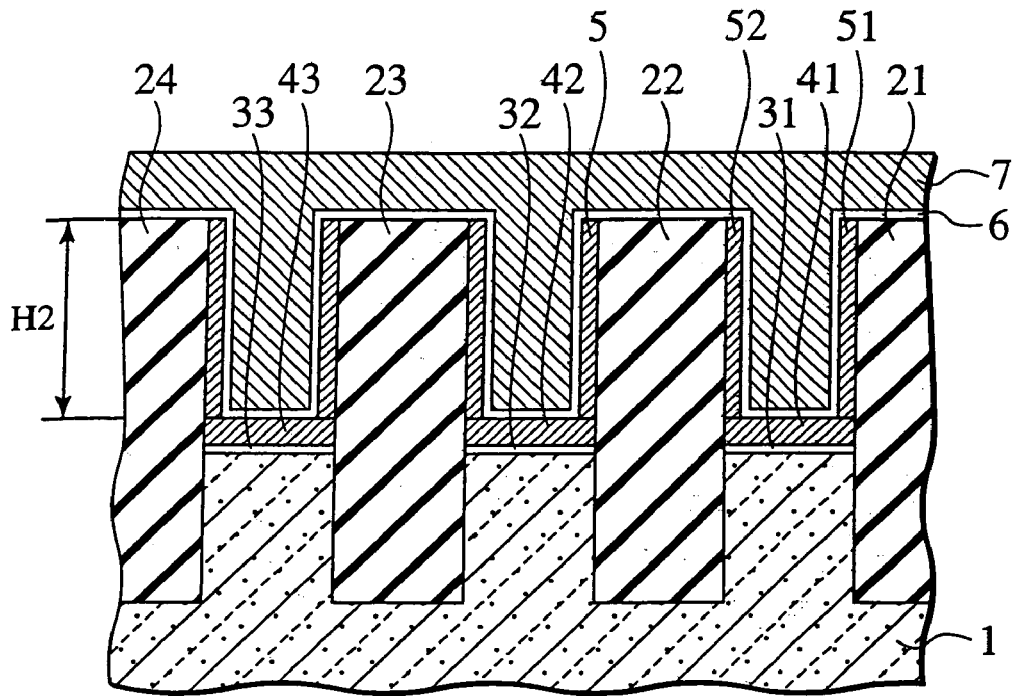
FIG. 6 is a sectional view showing a semiconductor device in accordance with a first modified example of the first embodiment.

As shown in FIG. 6, capacitive coupling between a floating gate and a control gate can be increased by increasing the height H2. In order to increase the height H2, the film thickness of a cap 91 and the like are principally increased. The height H2 is substantially equal to the film thickness of the cap 91 and the like. There is no need to increase the film thickness of the conductor 41 in order to increase the coupling capacitance. When the height H2 is increased, the parasitic capacitance C1 between the floating gates increases. However, the increment of the parasitic capacitance C1 with the height H2 is increased, is smaller than that of the increase of capacitance between each of the floating gates 41, 51, and 52 and the control gate 7.

Second Modified Example of First Embodiment

In the first embodiment, the side face of the second floating gate 51 and the like provided at the side face of each of the isolation regions 21 to 24 are perpendicular to the surface of the substrate 1. In such a case, where these faces are vertically parallel to each other, the control gates 7 and 27 are formed in a striped shape, as shown in FIG. 1A, by means of RIE (Reactive Ion Etching). When this etching is carried out, the control gate 7 and the floating gates 51 and 52 are processed to be etched continuously using the same mask in a self-aligned manner. At this time, a vertical insulation film 6 between the side face of each of the floating gates 51 and 52 and the side face of the control gate 7 is difficult to remove. The unremoved insulation film 6 acts as a mask, and when etching of the first electric conducting film 41 at the lower layer etching residue can occur. This etching residue produces electrical shorts between the floating gates in the adjacent cells. This etching residue causes malfunction of the semiconductor device thus, reducing the yield.

Figure 7:
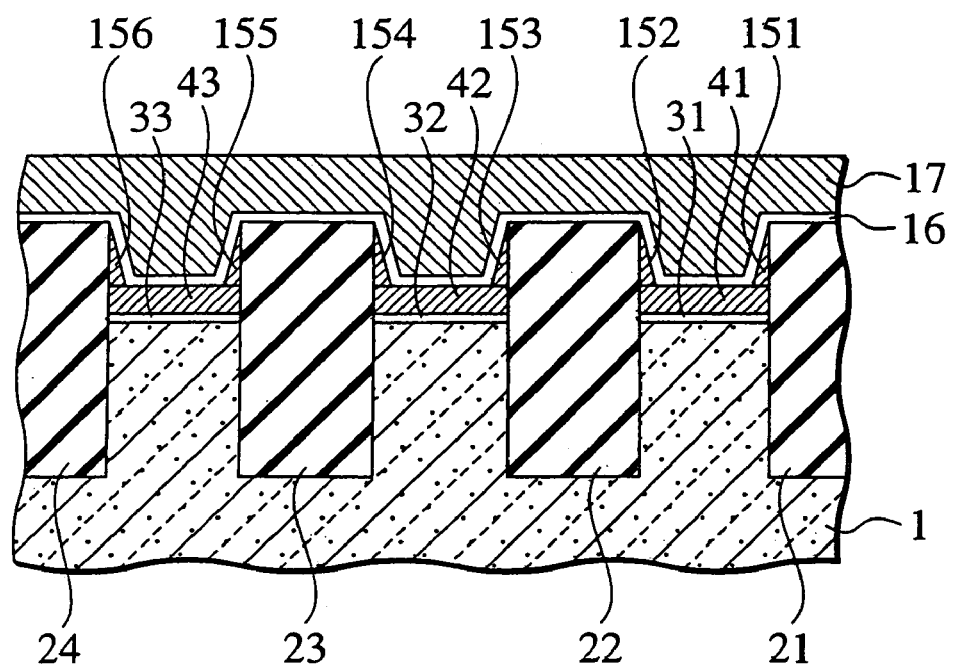
FIG. 7 is a sectional view showing a semiconductor device in accordance with a second modified example of the first embodiment.

In accordance with a second modified example of the first embodiment, as shown in FIG. 7, the sectional shapes of the second and third conductors 151 to 156 are formed in a tapered shape. The processing facility of the insulation film 16 during etching is enhanced by this shape. The second and third conductors are formed in a downward tapered shape, whereby the insulation film 16 is diagonally disposed. Even by means of anisotropic etching such as RIE, the insulation film 16 can be easily removed with a small amount of etching. This downward tapered shape can be achieved by changing the etching condition for separating the second and third conductors 151 to 156 from each other (for example, by lowering a substrate temperature) during etching.

Second Embodiment

Figure 8A:
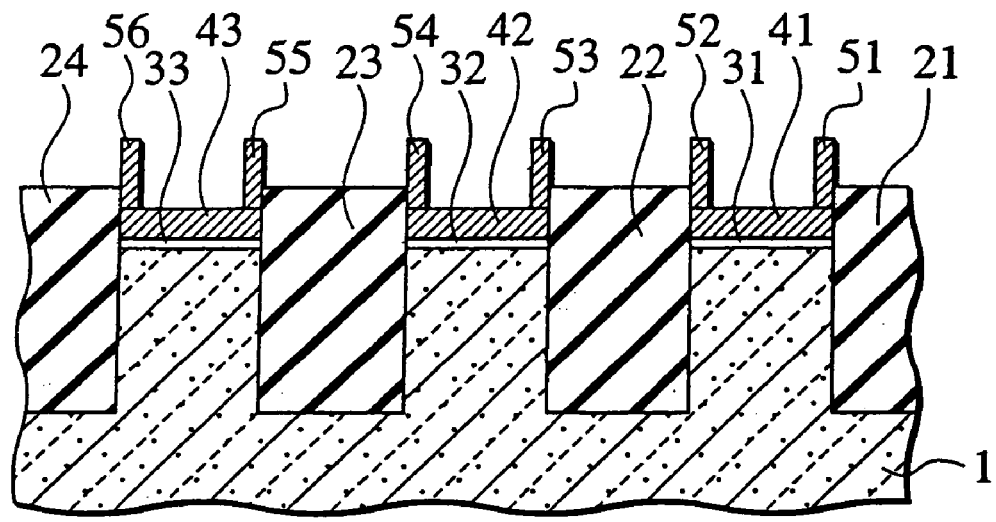
FIG. 8A and FIG. 8B are sectional views each showing a semiconductor device in accordance with a second embodiment.
Figure 8B:
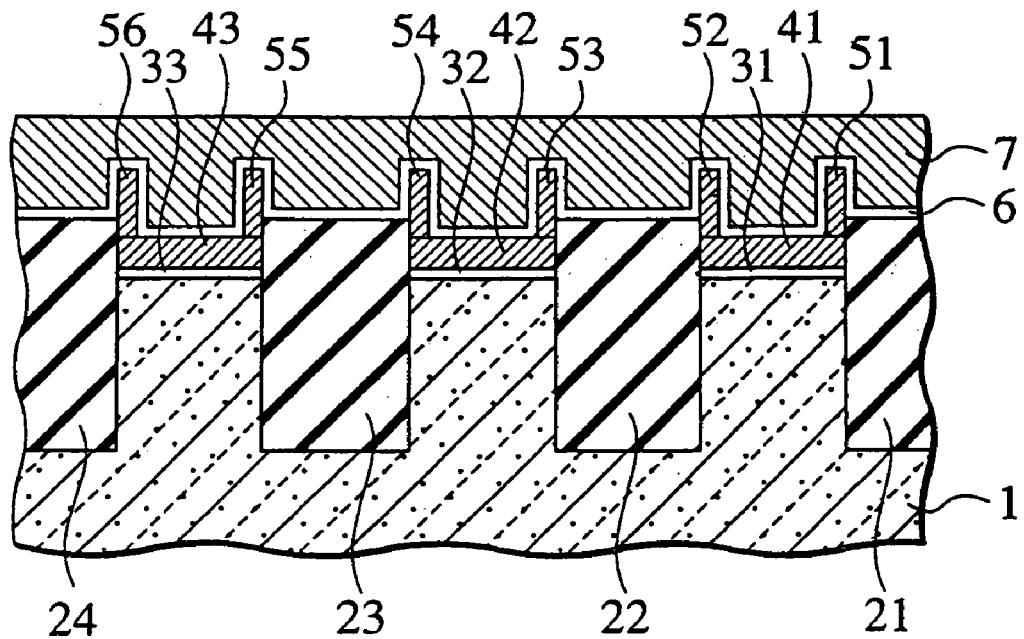

In the first embodiment, only the inner faces of trench 11 of each of the second and third conductors 51 to 56 are proximal to the control gate 7. In a second embodiment, as shown in FIG. 8B, the outer faces of the trench 11 of each of the second and third conductors 51 to 56 are proximal to the control gate 7 as well. In a semiconductor device of the second embodiment, the capacitive coupling between each of the second and third conductors 51 to 56 and the control gate 7 can be increased more than in the semiconductor device of the first embodiment.

The manufacturing method is identical to that in accordance with the first embodiment with respect to the steps (1) to (5), as shown in FIG. 4B. Next, as shown in FIG. 8A, for example, the isolation regions (STI) 21 to 24 are etched back in accordance with a wet etching technique. The subsequent steps are identical to the step (6) onwards of the first embodiment, as shown in FIG. 4C. That is, as shown in FIG. 8B, the insulation film 6 is formed on the first conductors 41 to 43 and the second and third conductors 51 to 56. Further, an electric conducting film that is a control gate 7 is formed on the insulation film 6. By using such a structure, both side faces of the second and third conductors 51 to 56 can be coupled with the control gate capacitively. When the height of the second and third conductors 51 to 56 is identical to those of first embodiment, the capacitive coupling in accordance with the second embodiment is larger than that in the first embodiment. In addition, in order to obtain capacitive coupling in size equal to that of the first embodiment, the height of the second floating gate 51 in the second embodiment can be smaller than that of the first embodiment.

The height of the top face of the isolation regions 21 to 24 are each defined to be larger than that of the top face of the polycrystalline silicon film of the first conductors 41 to 43 each. In this manner, a short circuit between the control gate 7 and the control gate 27 shown in FIG. 1A and FIG. 2A can be prevented.

Figure 9A:
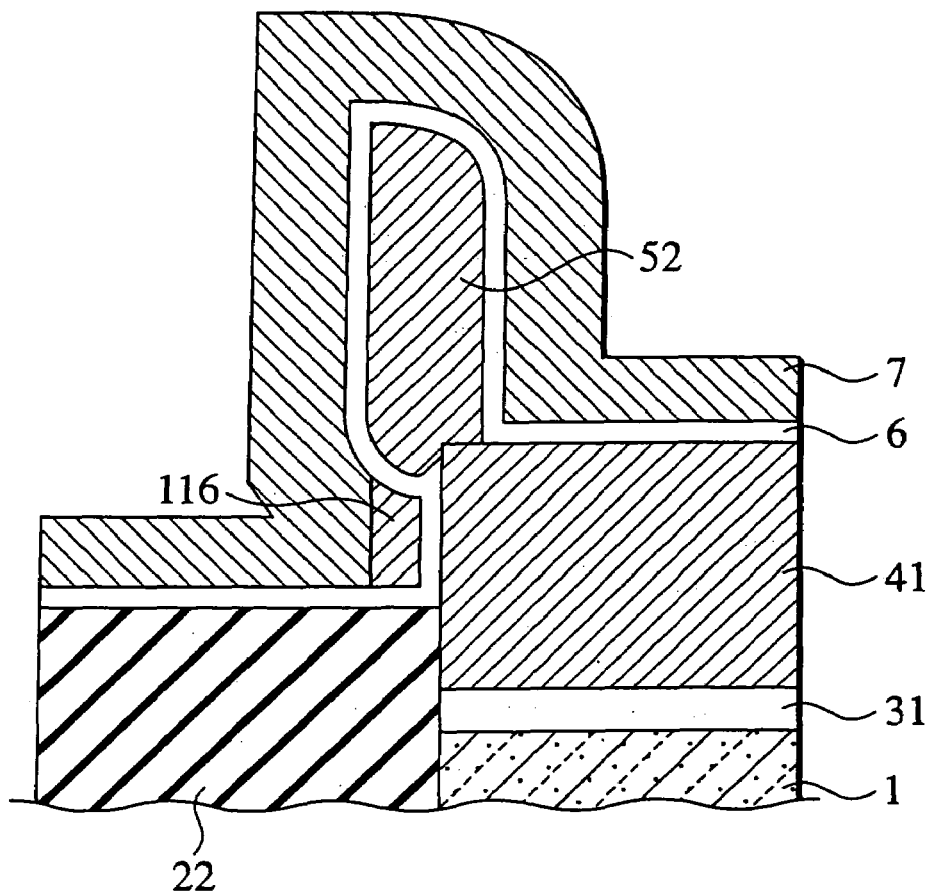
FIG. 9A and FIG. 9B are sectional views each showing detailed parts of a comparative example of the semiconductor device in accordance with the second embodiment.

In contrast to this embodiment, as shown in FIG. 9A, a disadvantage will be given with respect to a case in which the height of the top face of the isolation region 22 is smaller than that of the top face of a first conductor 41. In this case, the control gate 7 is provided at a position that is lower than the height of the top face of the first conductor 41. Then, the control gate 7 is provided downwardly of a third conductor 52 as in a region 116. This is because the third conductor 52 is spread in the isolation region 22 more significantly than the first conductor 41. The third conductor 52 is disposed over the isolation region 22. This spreading occurs during preprocessing of the step of depositing the third conductor 52 on the first conductor 41. In this preprocessing, a native oxide film on the first conductor 41 is removed by etching. At this time, an exposed isolation region 22 is also etched, and the interval between the isolation regions 21 and 22 is increased.

Then, in the structure shown in FIG. 9A, the control gate 7 and the control gate 27 are separated from each other. The control gate 7, the block insulation film 6, the conductor 52, and the first conductor 41 are etched substantially vertically by means of anisotropic etching. In this separation processing, the following fault occurs.

First, the control gate 7 is patterned and vertically processed. The block insulation film 6 remains unetched. A region 116 of the control gate 7 downward of the third conductor 52 also remains without being etched. This is because the third conductor 52 masks the region 116 from etchant.

Then, the block insulation film 6 is subjected to anisotropic etching. The block insulation film 114 under the third conductor 52 remains unetched. This is because the third conductor 52 masks the film 114 from etchant. The region 116 also remains unetched.

Lastly, the first conductor 41 is removed by etching. When this etching is carried out, the film 114 and region 116 may still remain unetched. This etching residue region 116 causes a short-circuit failure between the adjacent data control lines 7 and 27. This short-circuit fault was found out by the Inventor et al.

In a case where the region 116 is removed and no longer exists, with only the film 114 remaining after etching, a failure may occur. This is because, when ion implantation is carried out to form a source/drain region, the film 114 works as a mask for ion implantation. In addition, this is because, when etching is carried out to form a contact electrode in a source/drain region, the film works as an etching mask.

From the foregoing, in the second embodiment, the height of each of the isolation regions 21 to 24 at the memory cell section is controlled to be greater than that of the top face of the first floating gate 41. In this manner, the etching residue area 116 for the control gate electrode 7 does not occur.

Third Embodiment

In the first embodiment, the second and third conductors 51 to 56 are formed as sidewalls of the side faces of the isolation regions 21 to 24. The second and third conductors 51 to 56 are separated from each other in accordance with etching back steps. These etching back steps cause the following problems to occur.

First, the first and second conductors 51 to 56 which carry out the etching, are made of a polycrystalline silicon film. The first conductors 41 to 43 are provided at the lower layer of the second and third conductors 51 to 56. These first conductors 41 to 43 are also made of a polycrystalline silicon film. In the etching back steps, the first conductors 41 to 43 are also etched in order to reliably separate the second and third conductors 54 and 55 from each other. In this manner, the film thicknesses of a finish of the first conductors 41 to 43 each vary in size between and within of the semiconductor storage devices. The Inventor found the possibility that cell characteristics vary.

Next, the film thicknesses of the first conductors 41 to 43 each can be decreased in order to reduce the parasitic capacitance C1 between cells. This is because, even if the film thickness is decreased, the capacitive coupling between a control gate and a floating gate is not decreased. However, if the film thicknesses of the first conductors 41 to 43 each are decreased, the surface of the thin films 41 to 43 each is etched in the etching back steps. In this etching, a pinhole defect occurs with the thin films 41 to 43. The Inventor found the possibility of this degrading the reliability of tunnel oxide films 31 to 33 in the lower layer of the films 41 to 43.

Lastly, in FIG. 8A, the second and third conductors 51 to 56 each have an area that comes into contact with the first floating gates 41 to 43 in the lower layer. From the foregoing, the Inventor investigated the possibility that, if the heights of the second and third conductors 51 to 56 are too large, the second and third conductors 51 to 56 are released from the first conductors 41 to 43, and the released conductors fall down.

In the third embodiment, the second and third two conductors 51 and 52 of one memory cell each have an integrated structure by which they are connected to each other without being separated. In the etching back steps of separating the third and second conductors 54 and 55 from each other, a first conductor 43 is not exposed between the second and third conductors 55 and 56.

That is, a semiconductor device in accordance with the third embodiment has a semiconductor substrate 1 having plural trenches on a surface, as shown in FIG. 1A. The isolation regions 21 to 24 are placed in the trenches. The side faces of the isolation regions 21 to 24 are each provided at a position higher than the surface of the substrate 1. The tunnel oxide films 31 to 33 are provided on the surface of the substrate 1. Both ends of the tunnel oxide films 31 to 33 come into contact with the isolation regions 21 to 24. A floating gate has the first conductors 41 to 43 and the second conductors 51 to 53. The first conductors 41 to 43 are provided on the surfaces of the tunnel oxide films 31 to 33.

Both end faces of the first conductors 41 to 43 come into contact with the isolation regions 21 to 24. The second conductors 51 to 53 are provided on the surfaces of the first conductors 41 to 43. The bottoms of the second conductors 51, 53, and 55 come into contact with the first conductors 41 to 43. Both ends of the second conductors 51, 53, and 55 are higher than the center. The heights at both ends of these conductors are each substantially equal to the height of the top face of the isolation region. The insulation film 6 between the floating gate and the control gate comes into contact with the surfaces of the second conductors 51 to 53. The insulation film 6 is provided on the top faces of the isolation regions 21 to 24. The control gate 7 is provided on the insulation film 6.

The floating gate is laminated in two layers made of the first conductors 41 to 43 and the second conductors 51 to 53. In the second conductors 51 to 53 in accordance with the third embodiment, while the second and third conductors 51 and 52 in accordance with the first and second embodiments are integrally coupled with each other on the first conductors 41 to 43. In the conductors 41 to 43 and 51 to 53, the thickness is defined to be small, whereby the parasitic capacitance C1 between the floating gates of the adjacent memory cells can be reduced without decreasing the capacitance between the floating gate and the control gate.

Now, a method of manufacturing a semiconductor device in accordance with a third embodiment will be described here.

The manufacturing method used is substantially identical to that described with reference to FIG. 3A to FIG. 4A in accordance with the first embodiment. That is, the trench sections 10, the first conductors 41 to 43, and the active region are processed in a self-aligned manner.

(1) As shown in FIG. 3A, on a p-type silicon (Si) substrate 1, silicon oxide films or silicon oxynitride films 31 to 33 ($SiO_2$) are formed by thermal oxidation. These silicon oxide films or silicon oxynitride films 31 to 33 are produced as a tunnel oxide film of a nonvolatile memory cell. The film thickness of the silicon oxide films or silicon oxynitride films 31 to 33 each is within a range of 3 nm to 15 nm. The film thickness of the silicon oxide films or silicon oxynitride films 31 to 33 each is for example about 10 nm. Subsequently, a polycrystalline silicon (Si) film is formed as part of the first conductors 41 to 43 of a floating gate on the silicon oxide films 31 to 33. The film thickness of the first conductors 41 to 43 each is within a range of 10 nm to 500 nm. The film thickness of the first conductors 41 to 43 each is for example about 30 nm. Further, a silicon nitride film that serves as the caps 91 to 93 is deposited on each of the first conductors 41 to 43. The film thicknesses of the cap materials 91 to 93 each are within a range of 3 nm to 500 nm. The film thicknesses of the cap materials 91 to 93 are for example about 120 nm.

Next, the trenches 10 are grooved in the regions that are defined as the isolation regions 21 to 24 by means of photolithography and etching. Specifically, the caps 91 to 93, the first conductors 41 to 43, and the silicon substrate 1 are etched in sequence in the regions that are defined as the isolation regions 21 to 24. As shown in FIG. 3A, the trenches 10, the first conductors 41 to 43, and the caps 91 to 93 can be formed in a self-aligned manner. In this form, cell minuteness can be enhanced, and a variation in memory cell characteristics caused by the effects of electric field concentration can be suppressed because no floating gate is formed to cover the corner portions of the active regions. The depth of the trenches 10 in the silicon substrate 1 is within a range of 50 nm to 1000 nm. The depth of the trenches 10 in the silicon substrate 1 is about 300 nm, for example. After forming the trenches 10 for isolation, a thin silicon oxide film is formed on an exposed face between the substrate 1 and the first conductor by a thermal oxidization technique as required. The film thickness of this thin silicon oxide film is within a range of 3 nm to 20 nm. The film thickness of this thin silicon oxide film is for example about 5 nm.

Next, an insulation film is placed in the trenches 10, for example, by a HDP (High Density Plasma) technique. After an filler material has been deposited, the insulation film is polished and flattened up to the top face of the caps 91 to 93 by a method such as CMP (Chemical Mechanical Polish technique. As shown in FIG. 3B, the isolation regions 21 to 24 are placed at the ends of the floating gates 41 to 43 in a self-aligned manner. As shown in FIG. 3B, the isolation regions 21 to 24 are filled up to the ends of the floating gates 41 to 43 in a self-aligned manner. Next, as shown in FIG. 3C, the cap materials 91 to 93 are removed. In this manner, the trench sections 11 surrounded by the isolation regions 21 to 24 is formed. Next, a thin polycrystalline silicon film 5 produced as the second conductors 51 to 53 of a floating gate electrode is deposited. The film thickness of this polycrystalline silicon film 5 is within a range of 3 nm to 250 nm. The film thickness of this polycrystalline silicon film 5 is for example about 20 nm. The above manufacturing method is basically identical to that in the first embodiment.

Figure 12A:
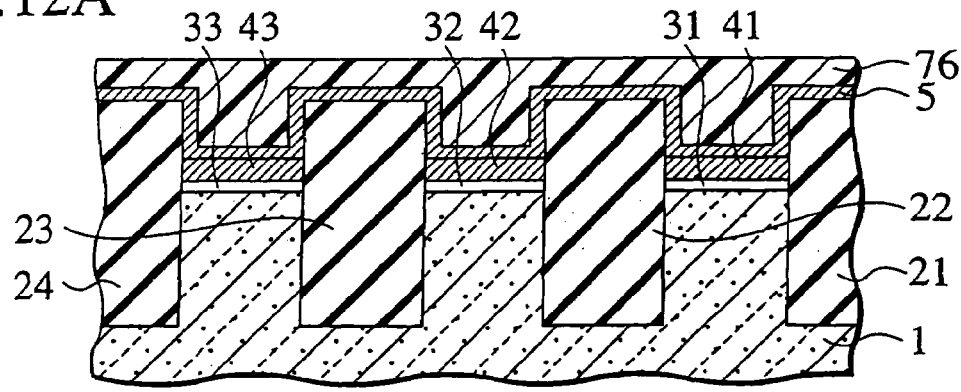
FIG. 12A to FIG. 12D are sectional views each showing a semiconductor device in accordance with the third embodiment by manufacturing process.
Figure 12B:
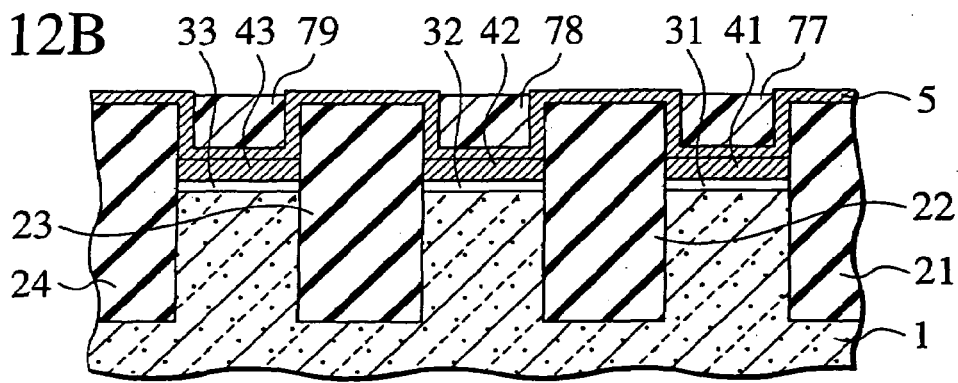
Figure 12C:
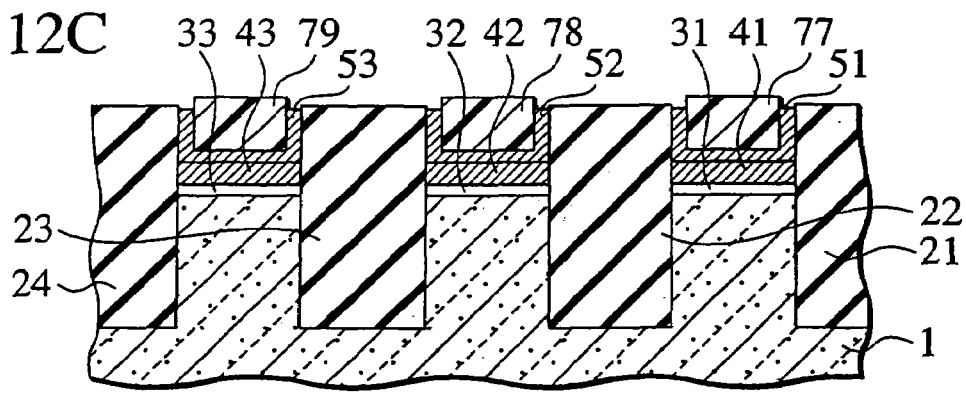
Figure 12D:
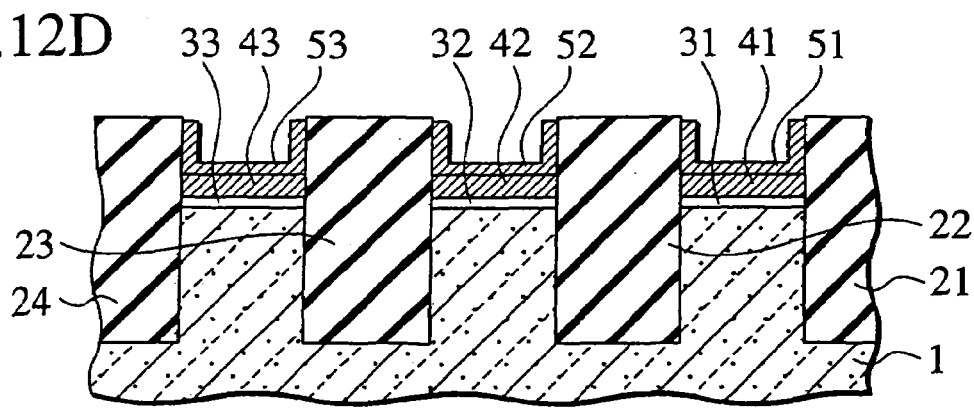

Next, as shown in FIG. 12A, for example, a photoresist 76 is fully coated on the polycrystalline silicon film 5. As shown in FIG. 12B, a resist 76 is etched back. In this manner, a polycrystalline silicon film 5 positioned on the isolation regions 21 to 24 is exposed. The etched back resists 77 to 79 are placed into the trenches 11. As shown in FIG. 12C, for example, the polycrystalline silicon film 5 on the isolation regions 21 to 24 are removed by means of etching back using an RIE technique. The second conductors 51 to 53 of the floating gate electrode are formed. As shown in FIG. 12D, the resists 77 to 79 are removed.

Figure 11A:
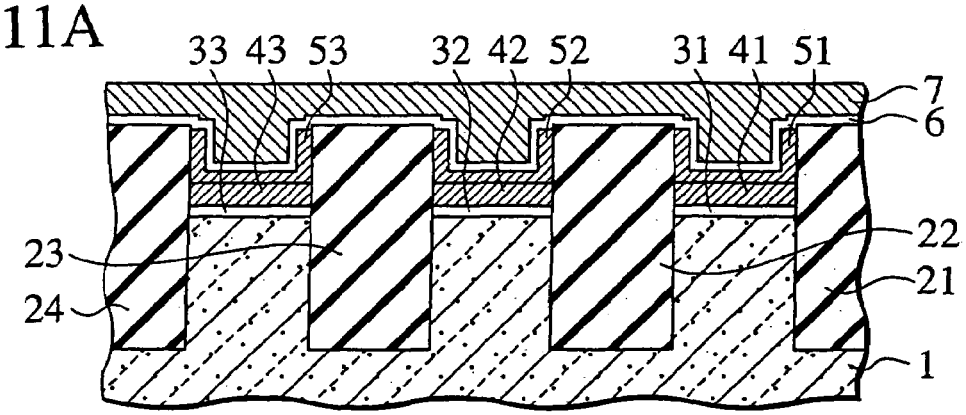
FIG. 11A is a sectional view showing a semiconductor device in accordance with a third embodiment.

Lastly, the insulation film 6 between the floating gate and the control gate is formed on each of the second conductors 51 to 53 and the isolation regions 21 to 24. Then, as shown in FIG. 11A, a polycrystalline silicon film produced as the control gate 7 is deposited.

First Modified Example of Third Embodiment

Figure 9B:
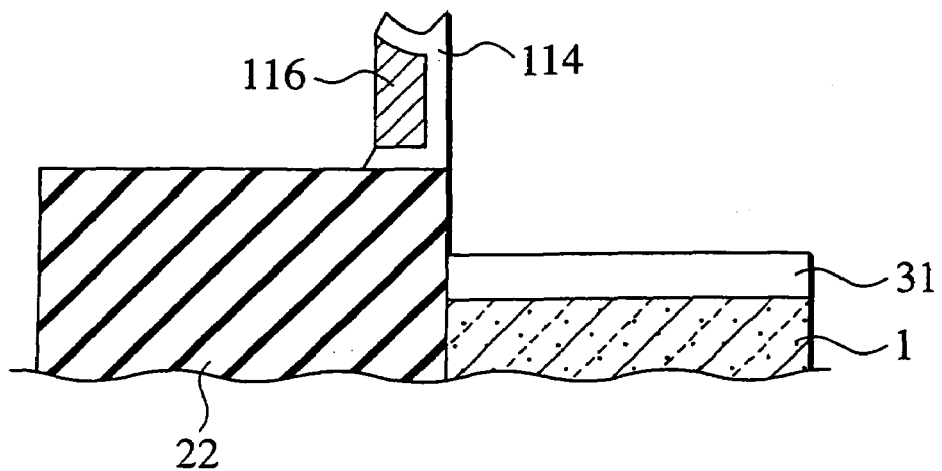
Figure 11B:
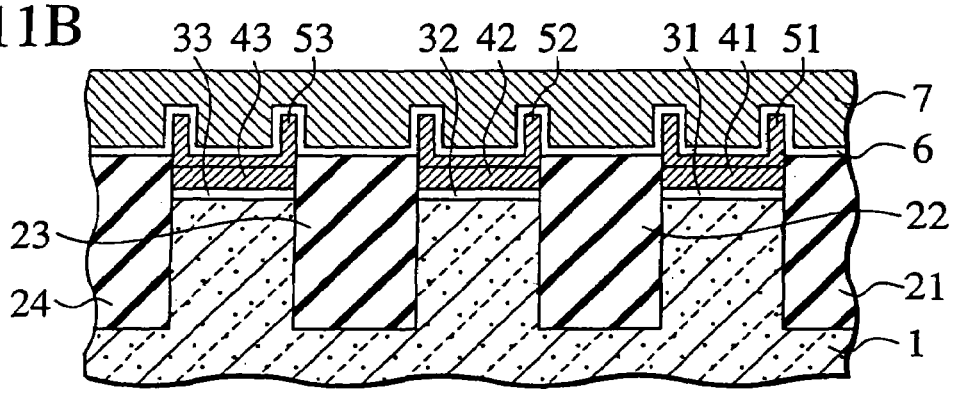
FIG. 11B is a sectional view showing a semiconductor device in accordance with a first modified example of the third embodiment.
Figure 11C:
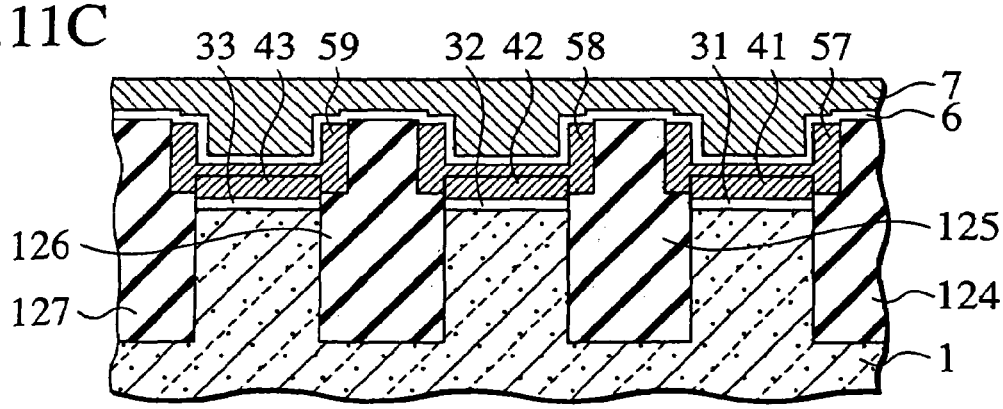
FIG. 11C is a sectional view showing a semiconductor device in accordance with a second modified example of the third embodiment.

In a semiconductor device in accordance with a first modified example of the third embodiment, as shown in FIG. 11B, the heights of the top face of the isolation regions 21 to 24 lower than that of the tops of the second conductors 51 to 53. The heights of the top faces of the isolation regions 21 to 24 are each equal to or greater than that of the tops of each of the second conductors 51 to 53. Therefore, etching residue, as shown in FIG. 9, does not occur. The control gate 7 disposed over the isolation regions 21 to 24 and the second conductors 51 to 53 are proximal to each other via the insulation film 6. That is, at a side face portion at the outside of the second conductors 51 to 53, the second conductors 51 to 53 are proximal to each other via the control gate 7 and insulation film 6. In this manner, in the first modified example of the third embodiment, the capacitive coupling between the control gate 7 and each of the floating gates 51 to 53 can be increased more significantly as compared with the third embodiment.

Figure 13A:
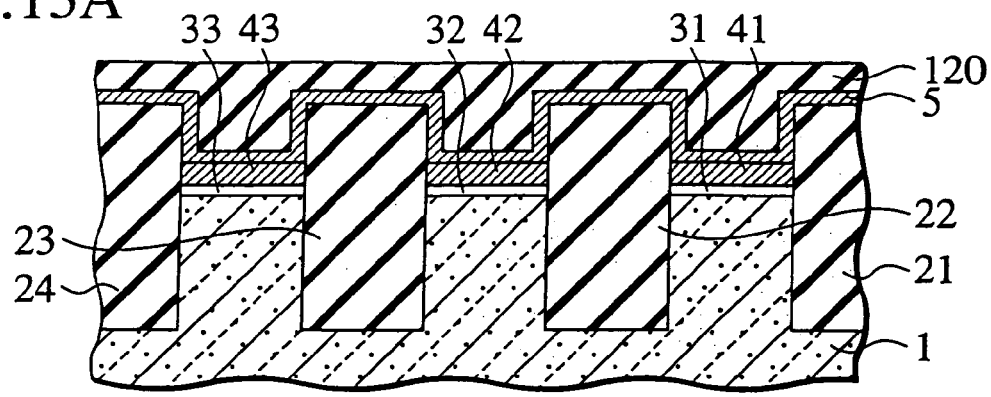
FIG. 13A to FIG. 13D are sectional views each showing a semiconductor device in accordance with a first modified example of the third embodiment by manufacturing process.
Figure 13B:
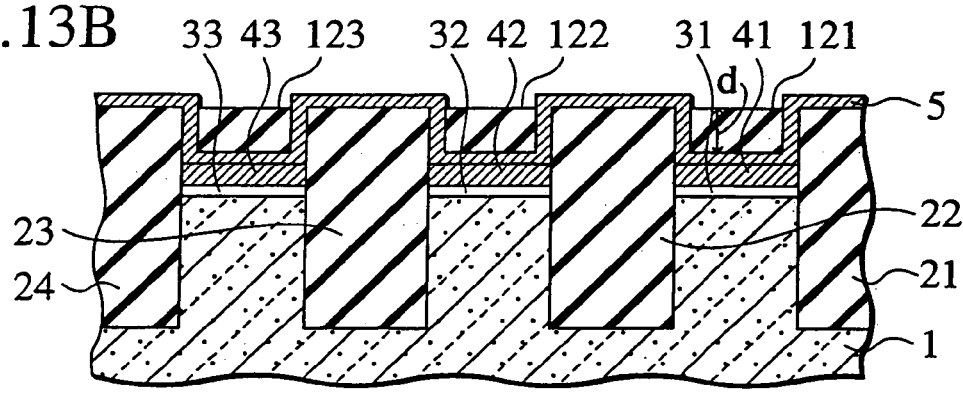

Now, a method of manufacturing a semiconductor device in accordance with the first modified example of the second embodiment will be described. The steps executed until the second conductor 5 shown in FIG. 4A is deposited are identical to those in accordance with the first and third embodiments. Next, as shown in FIG. 13A, a silicon oxide 120 is deposited by the CVD technique. As shown in FIG. 13B, the silicon oxide film 120 is etched back. A second conductor 5 over the isolation regions 21 to 24 is exposed. The silicon oxide films 121 to 123 are filled into the trenches 11. At this time, it is desirable that the residual film thickness "d" of the silicon oxide films 121 to 123 of the trench 11 is less than the etching depth of the isolation regions 21 to 24 as will be shown in FIG. 13D.

Figure 13C:
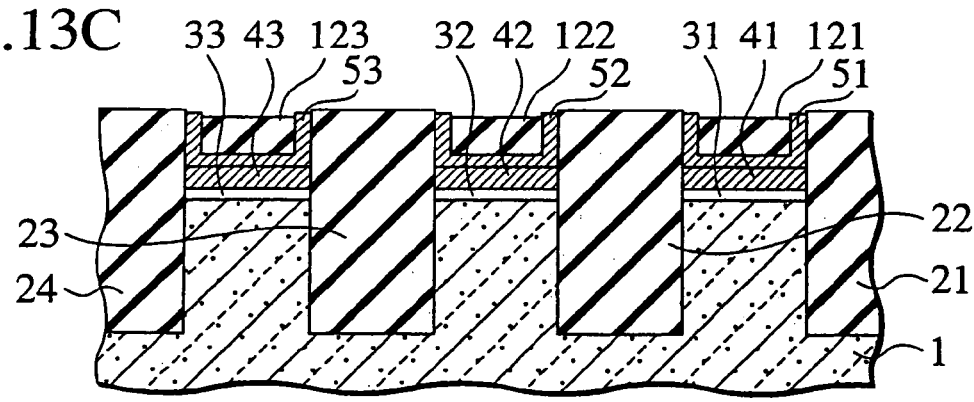

Next, as shown in FIG. 13C, the second conductor 5 provided on the isolation regions 21 to 24 is removed by means of the CMP technique or etching back technique. The second conductor 5 is separated from the second conductors 51 to 53. In accordance with the CMP technique, the height of the second conductor remaining on the side face of the trenches 11 can be precisely controlled.

Figure 13D:
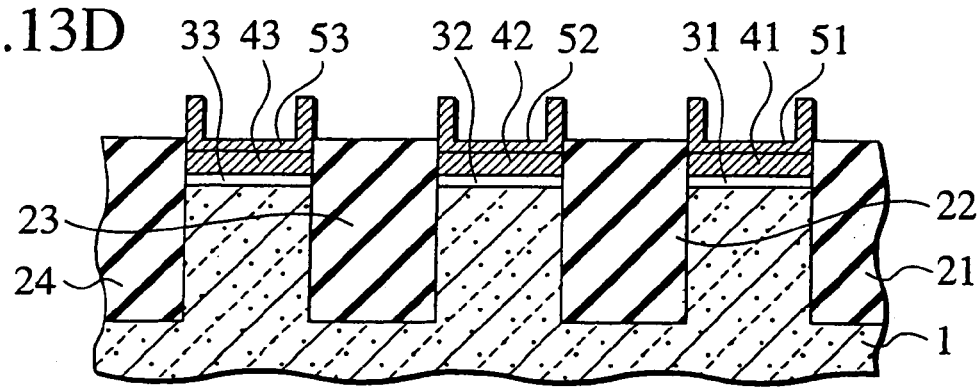

Next, as shown in FIG. 13D, the silicon oxide films 121 to 123 and the isolation regions 21 to 24 are etched. By means of this etching, the silicon oxide films 121 to 123 in the trenches 11 are removed. The top face of the second conductor is exposed. Then, the isolation regions 21 to 24 are etched to a desired depth. At this time, if the residual film thickness "d" of the silicon oxide films 121 to 123 are each less than the desired depth, the silicon oxide films 121 to 123 can be removed at the same time as when the isolation regions 21 to 24 are etched. By means of this etching, fin shaped protrusions are exposed in parallel pairs on the outer sides of each of the second conductors 51 to 53. The entire bottom faces of the second conductors 51 to 53 come into contact with the entire top faces of the first conductors 41 to 43, and thus, the protrusion is sturdy and difficult to knock down.

Lastly, as shown in FIG. 11B, the insulation film 6 is formed on the isolation regions 21 to 24 and each of the second conductors 51 to 53. A polycrystalline silicon film produced as the control gate 7 is deposited on the insulation film 6.

Second Modified Example of Third Embodiment

In a semiconductor device in accordance with a second modified example of the third embodiment, as shown in FIG. 1C, second conductors 57 to 59 are disposed on the isolation regions 124 to 127. In this manner, the area opposite the floating gates 57 to 59 and the insulation film 6 of the control gate 7 can be defined as larger than a semiconductor device in accordance with the third embodiment. In the second modified example of the third embodiment, the capacitive coupling between the control gate 7 and each of the floating gates 57 to 59 can be increased more significantly as compared with that in the third embodiment.

Figure 14A:
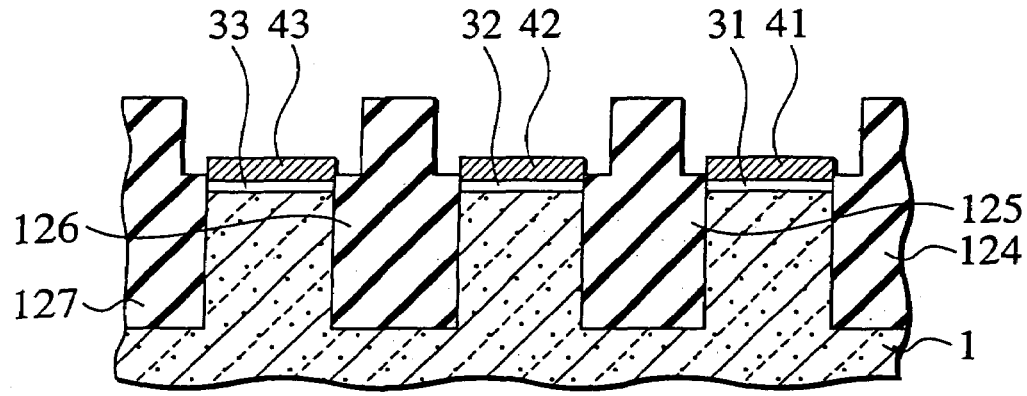
FIG. 14A to FIG. 14C are sectional views each showing a semiconductor device in accordance with a second modified example of the third embodiment by manufacturing process.

Now, a method of manufacturing a semiconductor device in accordance with a second modified example of the third embodiment will be described. The steps executed until up the cap materials 91 to 93 shown in FIG. 3C are removed are identical to those in accordance with the first and third embodiments. Next, as shown in FIG. 14A, the isolation regions 124 to 127 are etched by means of isotropic etching such as wet etching. By means of this etching, the isolation regions 124 to 127 are retracted. The isolation regions 124 to 127 laterally placed on the first conductors 41 to 43 are removed as well. The width of the trenches 11 is increased.

Figure 14B:
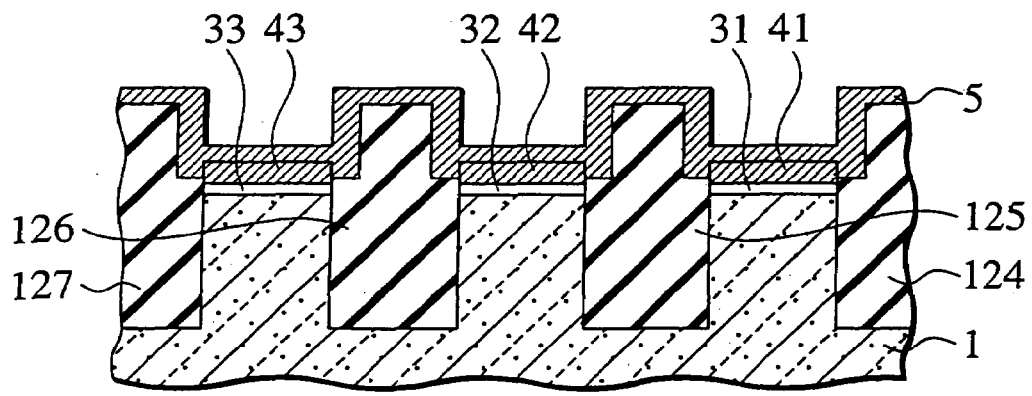
Figure 14C:
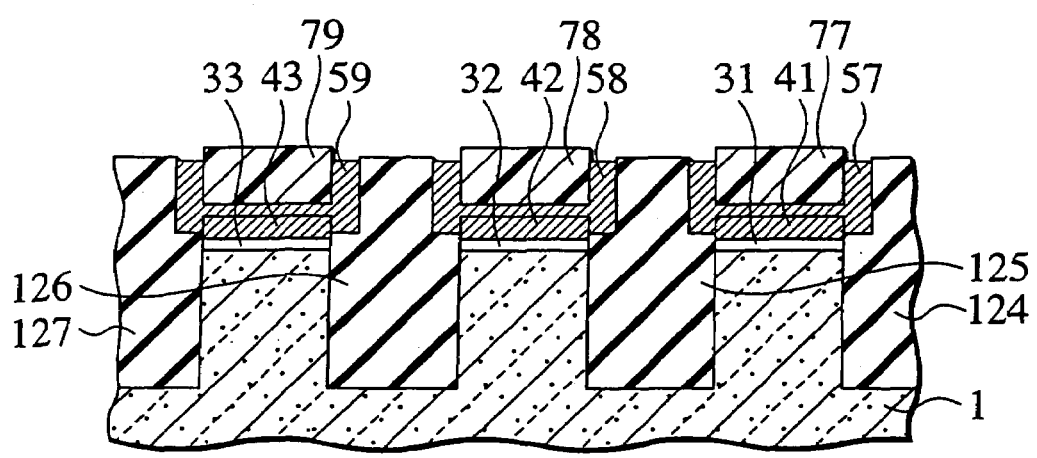

Next, as shown in FIG. 14B, a second conductor 5 is formed as a film on the isolation regions 124 to 127 and the first conductors 41 to 43. In particular, the second conductor 5 is formed as a film on the first conductors 41 to 43 as well. The subsequent manufacturing method is identical to that in accordance with the third embodiment shown in FIG. 12A to FIG. 12D. That is, as shown in FIG. 14C, when the second conductors 57 to 59 inside of the trenches 11 are protected with the photo resists 77 to 79, the second conductors 57 to 59 are divided. In accordance with such steps, a shape in which the second conductors 57 to 59 are extended on the isolation regions 124 to 127 can be formed.

Third Modified Example of Third Embodiment

A semiconductor device in accordance with a third modified example of the third embodiment has characteristics in accordance with the first modified example of the third embodiment and in accordance with the second modified example of the third embodiment, as shown in FIG. 1D. The side faces outside of the second conductors 57 to 59 are opposite to each other via the control gate and insulation material 6. In addition, the second conductors 57 to 59 are disposed on the isolation regions 124 to 127, and extend to the isolation regions 124 to 127.

The height of the top face of the isolation regions 124 to 127 is less than that of the top part of the second conductors 57 to 59 each. Then, the height of the top face of the isolation regions 124 to 127 are each equal to or greater than the bottom part of each of the second conductors 57 to 59. Therefore, the etching residue 116 shown in FIG. 9 does not occur. The control gate 7 is disposed over the isolation regions 124 to 127 and the second conductors 57 to 59 are opposite to each other via the insulation film 6. In this manner, in the third modified example of the third embodiment, the capacitive coupling between the control gate 7 and each of the floating gates 57 to 59 can be increased more significantly as compared with the third embodiment. A method of manufacturing a semiconductor device of a third modified example of the third embodiment is based on those of the first and second modified examples of the third embodiment.

Fourth Embodiment

Figure 11D:
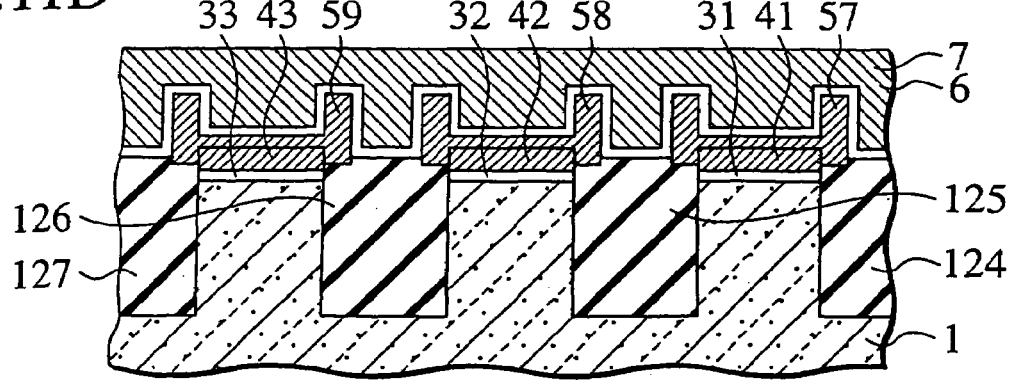
FIG. 11D is a sectional view showing a semiconductor device in accordance with a third modified example of the third embodiment.

A fourth embodiment describes the third modified example, in particular, of the third embodiment in more detail. The semiconductor device in accordance with the fourth embodiment is a nonvolatile semiconductor storage device with a NAND structure. The semiconductor device in accordance with the fourth embodiment is characterized in that the step difference between a region between a memory cell region and a peripheral circuit region and an upper face of the control gate electrode 7 in a memory cell region is small. In the fourth embodiment, insulation films 101 and 102 shown in FIG. 15B can be regarded as isolation regions 124 to 127 as well. In this manner, the shapes of the isolation regions 101, 102, 124, and 127 shown in FIG. 15B are considered to be identical to those of the isolation regions 124 to 127 in the third modified example of the third embodiment shown in FIG. 11D.

Figure 15A:
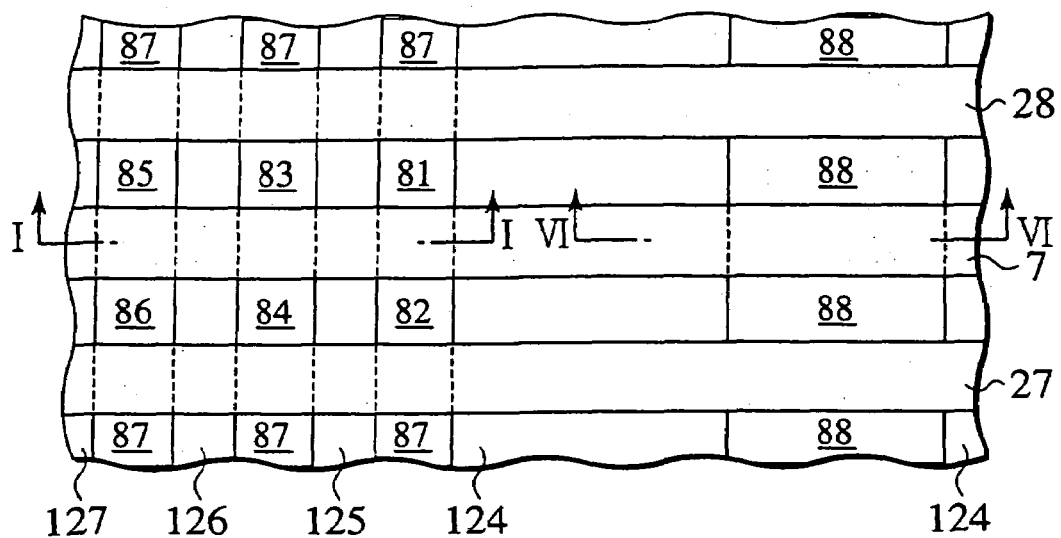
FIG. 15A is an upward perspective view and FIG. 15B and FIG. 15C are sectional views showing a semiconductor device in accordance with a fourth embodiment.
Figure 15B:
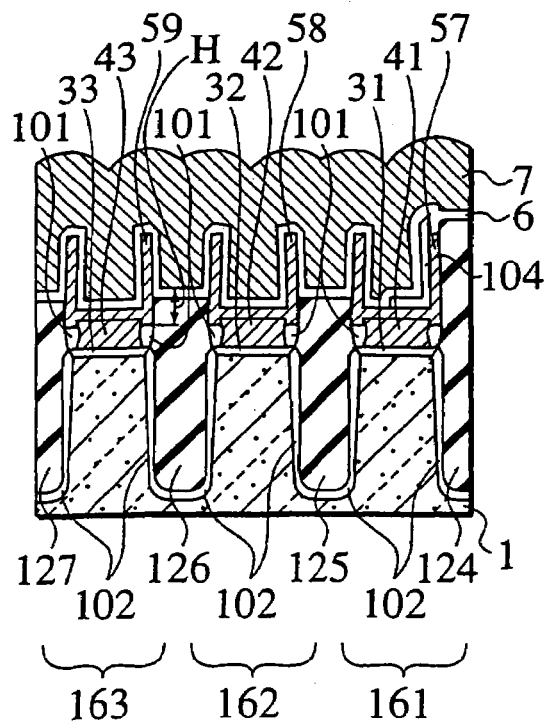
Figure 15C:
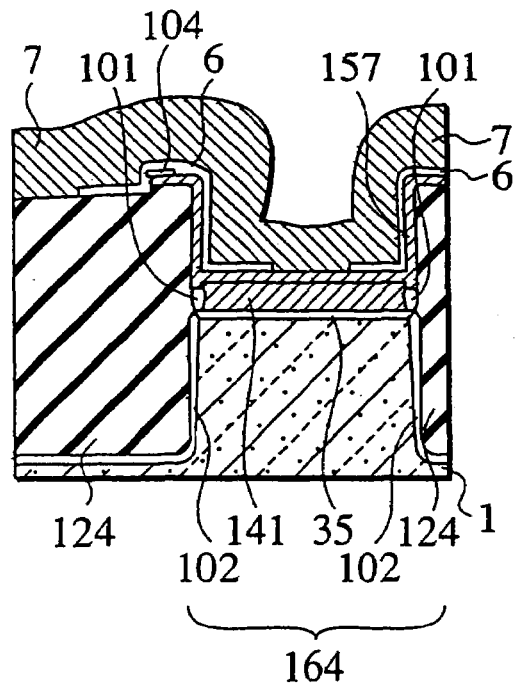

A memory cell region is shown in the left section of FIG. 15A and in FIG. 15B. The periphery circuit region is shown in the right section of FIG. 15A and in FIG. 15C. The control gates 28, 7, and 27 having widths equal to each other are disposed in a transverse direction in parallel at equal intervals in the memory cell region. The isolation regions 124 to 127 are disposed in a longitudinal direction in parallel downward of the control gates 28, 7, and 27 in FIG. 15A. In a memory cell region, the isolation regions 124 to 127 have widths equal to each other, and are disposed at equal intervals, for example. This placement makes the breakdown voltages of isolations uniform. This placement makes the channel conductance of cells uniform. This placement makes the transport characteristic of cells uniform. The source/drain regions 81 to 87 of the memory cells 162 and 163 and the dummy cell 161 are disposed in a region in which the control gates 28, 7, and 27 and the isolation regions 124 to 127 are not disposed. A source/drain region 88 of a periphery circuit 164 is provided in a region in which the control gates 28, 7, and 27 and the isolation region 124 are not disposed.

The bottom face of the control gate electrode 7 formed over the isolation regions 124 to 127 is disposed upward of a stacked direction than the top face of the first conductors 41 to 43. The maximum distance between the two outer side faces of the second conductor 58 is greater than that between two end faces of the first conductor 42. The lower face of the second conductors 58 and 59, i.e., the lower end of the outer side face is provided further down from the top face of the first conductors 42 and 43. The second conductors 58 and 59 are linked as one body on the first conductors 42 and 43. A distance between the two outer side faces of the second conductors 58 and 59 is reduced toward the top part of this side face. The control gate electrode 7 is opposed to the top face and side face of the second conductors 58 and 59 via the block insulation film 6. An isolation region 125 comes into contact with a second conductor 57. An isolation region 124 also comes into contact with the second conductor 57. The isolation region 124 is larger in width than the isolation region 125. The height of the top face of the isolation region 124 is larger than that of the top face of the isolation region 125.

A dummy cell 161 is formed between a memory cell array that consists of a plurality of memory cells 162 and 163 and a periphery circuit 164. The dummy cell 161 stabilizes an operation or process controllability of the memory cells 162 and 163. The dummy cell 161 has a structure that is substantially identical to the memory cells 162 and 163, and is formed adjacent to the memory cells 162 and 163. The number of dummy cells 161 may be formed in plurality, of course, without being limited to one. In addition, for the purpose of convenience to display signs clearly, the dummy cell 161 and the periphery circuit 164 are displayed separately from each other in FIG. 15B and FIG. 15C. The dummy cell 161 and peripheral circuit 164 are formed continuously using a common isolation region 124. The peripheral circuit 164 denotes a device that serves as a MIS transistor except the memory cells 162 and 163.

The impurity concentration of boron (B) of the p-type silicon substrate 1 is within the range of $10^{14}$ cm$^{-3}$ to $10^{19}$ cm$^{-3}$. On the p-type silicon substrate 1, for example, there are provided gate insulation films 31 to 33 and 35 that are a silicon oxide film or oxynitride film with 3 nm to 15 nm in thickness, for example. First conductors 41 to 43 and 141 that consist of polycrystalline silicon are provided on the gate insulation films 31 to 33 and 35. The first conductors 42 and 43 serve as a first charge storage layer of the floating gates of the memory cells 163 and 162. To the first conductors 41 to 43 and 141, for example, phosphor (P) or arsenic (As) are introduced within a range of $10^{18}$ cm$^{-3}$ to $10^{21}$ cm$^{-3}$. The thickness of the first conductors 41 to 43 and 141 is within a range of 10 nm to 500 nm. In addition, the gate insulation films 31 to 33 and 35 and the first conductors 41 to 43 and 141 are provided on a fully leveled plane. In this manner, a variation between cells in electrical characteristics of the memory cells 162 and 163 can be made uniform. A floating gate sidewall oxide film 101 is provided on the side face of the first conductors 41 to 43 and 141.

The second conductors 57 to 59 and 157 are provided on the first conductors 41 to 43 and 141 and the float gate sidewall oxide film 101. The second conductors 57 to 59 and 157 are polycrystalline silicon introduced within a range of $10^{18}$ cm$^{-3}$ to $10^{21}$ cm$^{-3}$ in impurity concentration where phosphor or arsenic is defined as impurities. The thicknesses of the second conductors 57 to 59 are within the range of 3 nm to 500 nm. Preferably, the thicknesses of the second conductors 57 to 59 are each smaller than half of the thicknesses of each of the first conductors 41 to 43, and within a range of 3 nm to 100 nm. Further, with in this range, capacitive coupling between the control gates is not reduced. In addition, the resistance component is hardly increased, leading to the result that a data readout time or write time is significantly increased. On the contrary, a capacitive coupling between cells can be decreased.

The second conductors 57 to 59 come into contact with the top part of the side face and the full face of the top face of each of the first conductors 41 to 43. That is, the second conductors 57 to 59 cover the top face and side face of the first conductors 41 to 43. In addition, the second conductors 57 to 59 are integrated as one body unlike the conductors 51 and 52 shown in FIG. 1B. In this manner, the second conductors 57 to 59 and the first conductors 41 t 43 come into intimate contact with each other in a larger area. Thus, the peeling off caused by the internal stress of the second conductors 57 to 59 and by the external force relevant to the second conductors 57 to 59 can be prevented.

The second conductors 58 to 59 each serve as a second charge storage layer of a floating gate of each of the memory cells 162 and 163. The top faces of the outer sides of the second conductors 58 and 59 are each higher than the top faces of the inside of the second conductors 58 and 59. The second conductors 58 and 59 are formed in a form of an uppercase letter H. The second conductors 58 and 59 have a first side face on the outside right and a second side face on the outside left. The second conductors 58 and 59 have a third side face on the inside left and a fourth side face on the inside left. The lower part of the first and second side face at the outside of the second conductors 58 and 59 comes into contact with the isolation regions 125 to 127. The block insulation film 6 is provided on the first, second, third and fourth side face. The block insulation film 6 is provided on the top face of inside of each of the second conductors 58 and 59. The block insulation film 6 is provided on each of the upper face inside of the second conductors 58 and 59. The control gate 7 is provided on this insulation film 6. The block insulation film 6 is formed of a silicon oxide film, an oxynitride film or a stacked film (ONO film) that consists of a silicon oxide film/a silicon nitride film/a silicon oxide film. The thickness of the silicon oxide film or the oxynitride film is with in a range of 5 nm to 30 nm. The thickness of a silicon oxide film/a silicon nitride film/a silicon oxide film of the ONO film is within a range of 2 nm to 100 nm in thickness, respectively. The control gate 7 is made of polycrystalline silicon introduced within a range of $10^{17}$ cm$^{-3}$ to $10^{21}$ cm$^{-3}$ in impurity concentration, where phosphor arsenic or boron is defined as impurities. In addition, the control gate 7 may be structured to be stacked with tungsten silicide (WSi) and polycrystalline silicon. In addition, the control gate may be structured to be stacked with nickel silicide (NiSi), molybdenum silicide (MoSi), titanium silicide (TiSi), cobalt silicide (CoSi), and polycrystalline silicon. The thickness of the control gate 7 is within a range of 10 nm to 500 nm. The block insulation film 6 and control gate 7 positioned over the isolation regions 125 to 127 are formed over the top faces of the first isolation regions 125 to 127. Similarly, the block insulation film 6 and control gate 7 positioned upward of the isolation regions 125 to 127 are formed over the lowest face of the second conductors 58 and 59. That is, the height H shown in FIG. 15B is obtained as a positive value. In this manner, an etching residue 116 of the control gate 7 described in FIG. 9 is not generated.

On the silicon substrate 1, the isolation regions 124 to 127 are provided with a liner insulation film 102. The isolation regions 124 to 127 are made of a silicon oxide film, for example. On the surface of the silicon substrate 1 on which the isolation regions 124 to 127 are not formed, the gate insulation film 31 to 33 and 35, the first conductors 41 to 43 and 141, and the second conductors 57 to 59 are provided in a self-aligned manner.

In the fourth embodiment, the second conductors are integrated as one body. In this manner, the contact area between each of the first conductors 42 and 43 and each of the second conductors 58 and 59 increase. Therefore, the capacitance or the conductance between each of the first conductors 42 and 43 and each the second conductors 58 and 59 is increased. Hence, the potential change in first conductors 42 and 43 can be increased when the potential of second conductors 58 and 59 changes. In addition, the coupling ratio between each of the first conductors 42 and 43 and the control gate electrode 7 is improved.

A protrusion at the outer side of the second conductors 58 and 59 are each inclined inwardly. The distance between the protrusion and the opposed inner side face is smaller further upward of the protrusion. In addition, the distance between the protrusion at the outer side of the second conductors 58 and 59 each and the opposed outer side face is larger further upward of the protrusion. In this manner, the capacitive coupling between the second conductors 58 and 59 of the adjacent memory cells can be decreased while the channel width of a transistor cell that is determined depending on a width of a silicon substrate 1 sandwiched by the isolation regions 125 to 127 is made constant without being changed. Hence, change in threshold voltage caused interferences by the capacitive coupling between the adjacent memory cells can be decreased while the transistor current driving capacity determined by channel width are maintained at a constant. In addition, a failure caused by a short-circuit between the second conductors 58 and 59 of the adjacent memory cells can be decreased.

Now, a method of manufacturing a semiconductor device in accordance with the fourth embodiment will be described here. In the semiconductor device manufacturing method in accordance with the fourth embodiment, a description will be given with respect to a method of manufacturing a memory cell region and a periphery circuit region of a semiconductor device. The manufacturing method is substantially identical to that in the first embodiment.

Figure 16A:
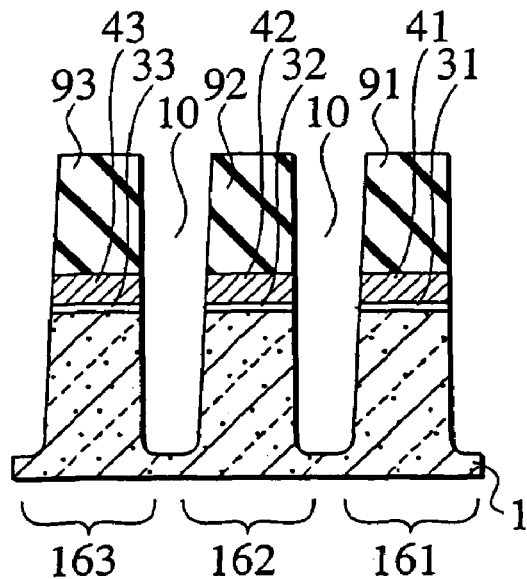
Figure 16B:
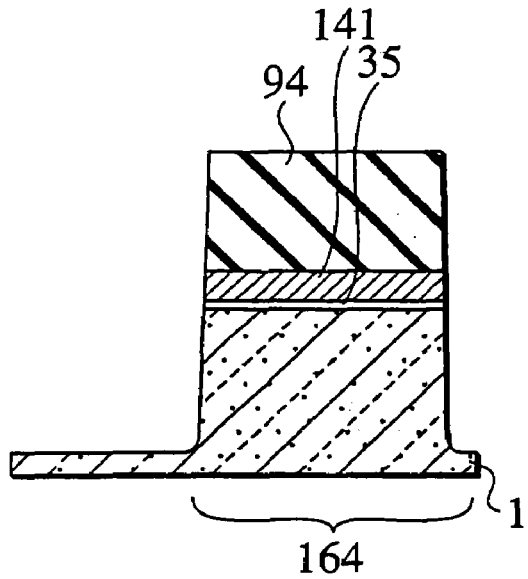

First, as shown in FIG. 16A and FIG. 16B, in memory cells 162 and 163, a dummy cell 161, and a peripheral circuit 164, an isolation trench section 10, first conductors 41 to 43, a gate electrode 141 of the peripheral circuit, and an active region 1 are processed in a self-aligned manner. The first conductors 41 to 43 and the gate electrode 141 of the peripheral circuit are not formed at the side face of the active region 1. In this manner, the minuteness of the cells 161 to 163 can be enhanced. In addition, floating gates 42 and 43 are not formed covering the corner portions of the active region 1, thus making it possible to suppress variation in memory cell characteristics caused by the effects of electric field concentration.

On a p-type silicon substrate, insulation films 31 to 33 and 35 are formed by oxidization or oxy-nitridation of the silicon substrate 1. The thicknesses of the insulation films 31 to 33 and 35 are each within a range of 3 nm to 15 nm. The insulation films 31 to 33 and 35 serve as tunnel oxide films 32 and 32, an insulation film 31 of the dummy cell 161, and a gate insulation film 35 of the peripheral circuit.

Next, the first conductors 41 to 43 and 141 are filmy formed on the insulation films 31 to 33 and 35. The first conductors 41 to 43 and 141 are made of polycrystalline silicon, and the film thickness is within a range of 10 nm to 500 nm. The first conductors 41 to 43 and 141 serve as the first floating gates 42 and 43 of the memory cells 162 and 163, the conductor 41 of the dummy cell 161, and the first gate electrode 141 of the peripheral circuit.

A silicon nitride film that serves as caps 91 to 94 is deposited on the first conductors 41 to 43 and 141. The height of each of the second conductors 57 to 59 formed later is determined by the film thickness of each of the caps 91 to 94. The film thicknesses of the caps 91 to 94 are within a range of 100 nm to 500 nm.

Next, as shown in FIG. 16A and FIG. 163, the trenches 10 are grooved in a region of is each of the isolation regions 124 to 127 by means of lithography steps and etching. Specifically, a resist pattern for masking regions other than the isolation regions 124 to 127 is formed. After masking the caps 91 to 94 patterned in this resist pattern, the caps 91 to 94, the first conductors 41 to 43 and 141, and the insulation films 31 to 33 and 35, and the silicon substrate 1 are etched in sequence using the transferred pattern to the caps. The isolation trenches 10, the first conductors 41 to 43 and 141 and the caps 91 to 94 are formed in a self-aligned manner. The depth of the isolation trenches 10 in the silicon substrate 1 is within a range of 50 nm to 500 nm. It is preferable that the sidewalls of the trenches 10 are formed in an upward-tapering shape. In particular, it is preferable that the exposed sidewall of the cap materials 91 to 94 each is formed in a forward tapered shape. In this manner, a memory cell can be separated without leaving an etching residue of a control gate electrode.

Figure 16C:
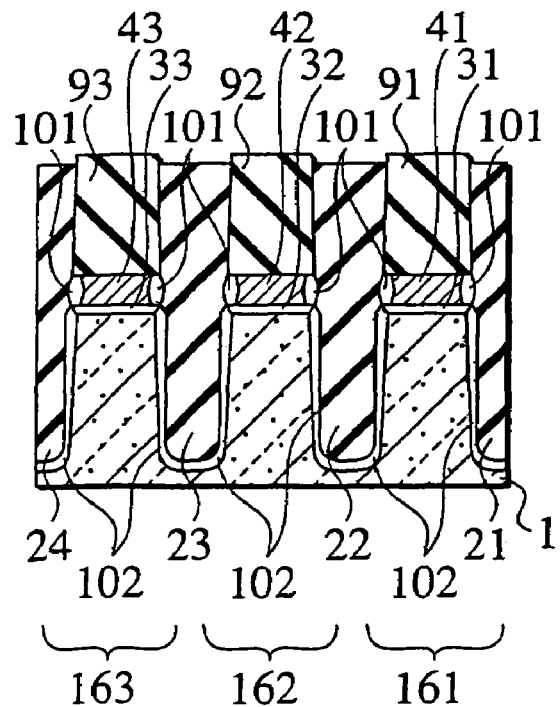
Figure 16D:
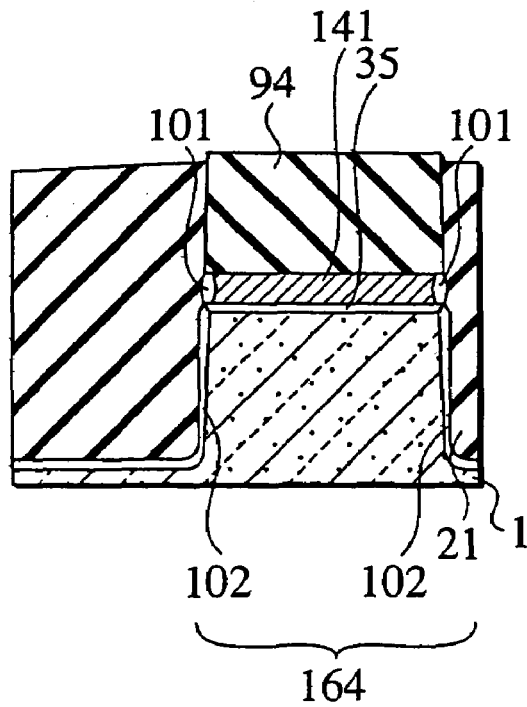

After grooving the trench 10, a thin liner oxide film 102 is filmy formed on the inner wall of the trenches 10. The liner oxide film 102 is formed by thermally oxidizing the silicon substrate 1. The film thickness of the liner oxide film 102 is within a range of 3 nm to 15 nm. During this thermal oxidization, the side faces of each of the first conductors 41 to 43 and 141 each are also oxidized, and the silicon oxide film 101 is formed. The cap materials 91 to 94 are difficult to oxidize. The first conductors 41 to 43 and 141 have a higher oxidization rates than the caps 91 to 94. As shown in FIG. 16A and FIG. 16D, the width of the first conductors 41 to 43 and 141 are each less than that of the caps 91 to 94.

Next, silicon oxide films 21 to 24 formed in accordance with an HDP (High Density Plasma) deposition technique, for example, are filled into the isolation trenches 10. The silicon oxide films 21 to 24 may be formed in accordance with a low pressure (LP) CVD technique. As shown in FIG. 16C and FIG. 16D, after depositing the silicon oxide films 21 to 24, while the cap materials 91 to 94 are used as etching-stoppers, the silicon oxidized films 21 to 24 are flattened in accordance with the CMP technique. In this manner, the isolation regions 21 to 24 are formed on the side faces of the cap materials 91 to 94 and silicon oxide film 101 in a self-aligned manner.

Figure 17A:
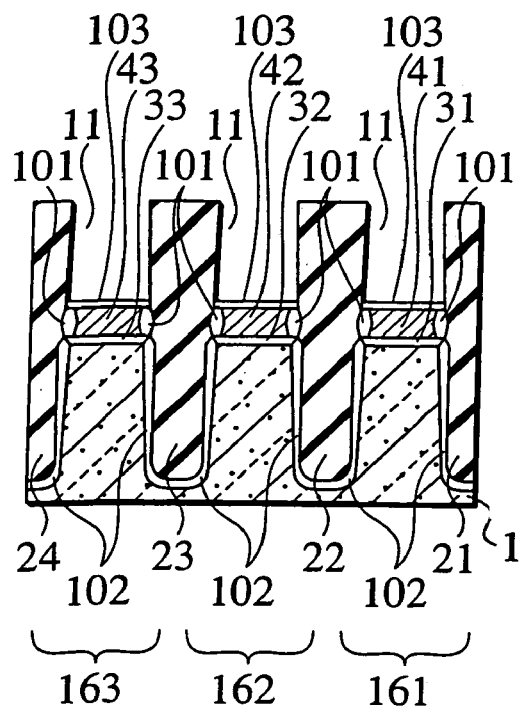
Figure 17B:
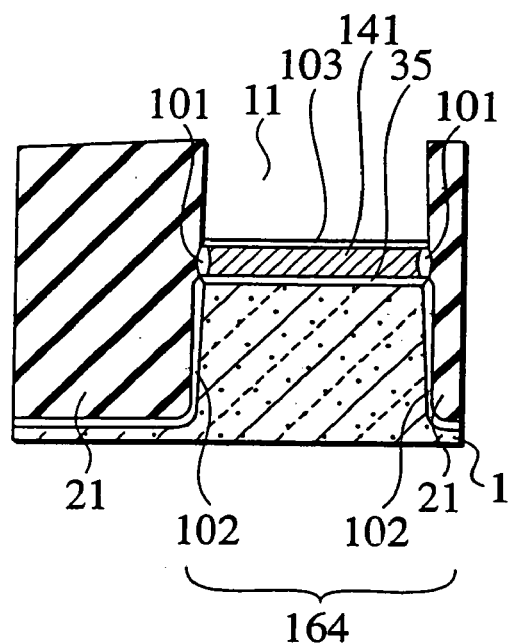
Figure 17C:
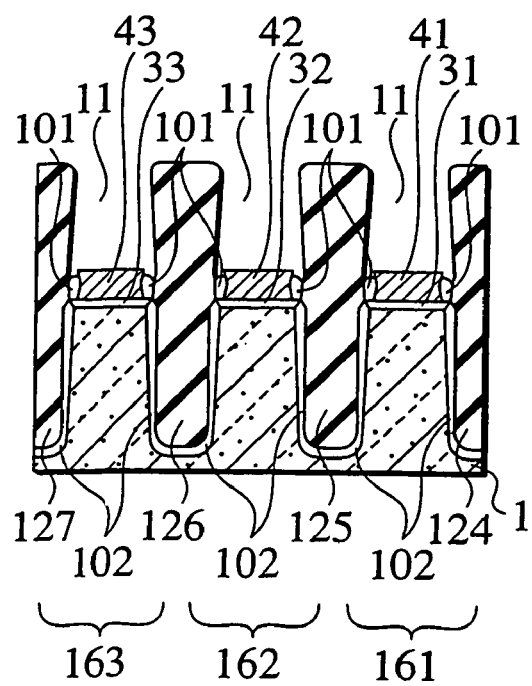
Figure 17D:
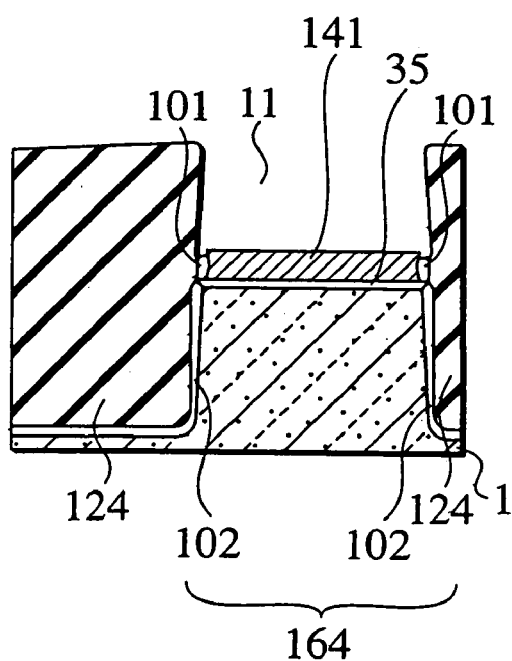

As shown in FIG. 17A and FIG. 17B, the cap materials 91 to 94 are selectively removed. In this manner, trench sections 11 surrounded by the isolation regions 21 to 24 are formed. The above steps can basically apply a method of manufacturing a semiconductor device in accordance with the first embodiment. The surface of the first conductors 41 to 43 and 141 are each exposed to the air by forming this trench section 11. Thus, a so-called native oxide film 103 is formed on each of the surface of the first conductors 41 to 43 and 141. The film thickness of this oxide film 103 depends on the time allowed before deposition of the second conductors 5, 57, and 59 which carried out. This oxide film 103 has poor uniformity and controllability of the film thickness, thus making it necessary to remove the film in order to obtain a uniform coupling ratio. The oxide film 103 is removed by wet etching using a fluoric acid. When wet etching is carried out using a fluoric acid, as shown in FIG. 17C and FIG. 17D, the top parts of the isolation regions 21 to 24 each formed of a silicon oxide film are etched. The isolation regions 124 to 127 having small widths are formed on the top of the isolation regions 21 to 24. The width of the trench sections 11 are increased. The oxide film 101 is etched at the same time. The oxide film 101 is etched because the widths of the first conductors 41 to 43 and 141 are each smaller than the widths 1 of each of the cap materials 91 to 94. When the cap materials 91 to 94 are removed, the oxide film 101 is exposed.

Figure 18A:
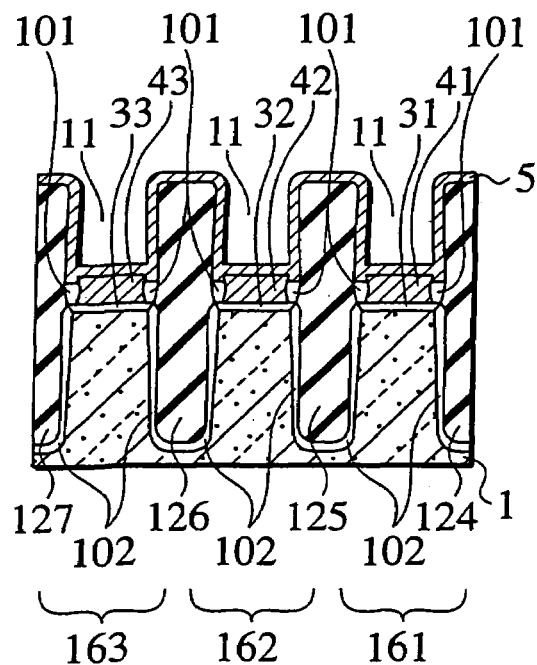
Figure 18B:
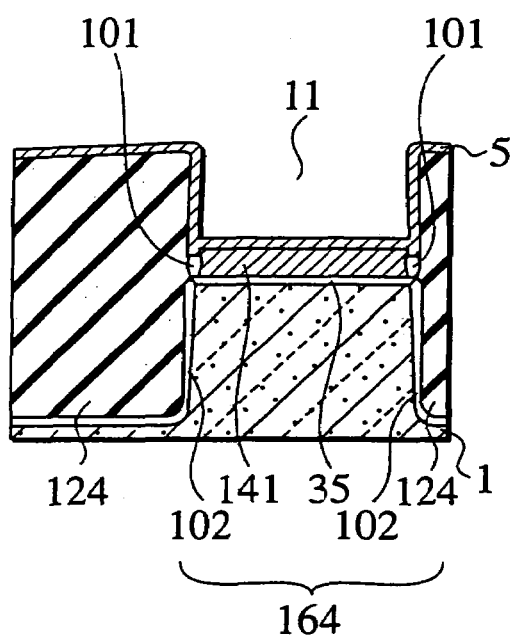

Next, as shown in FIG. 18A and FIG. 18B, a second conductor 5 is filmy formed on each of the first conductors 41 to 43 and 141, insulation film 101, and isolation regions 124 to 127. The second conductor 5 is made of a polycrystalline silicon film. The film thickness is within a range of 3 nm to 100 nm. In particular, the film thickness is preferably within a range of 10 nm to 30 nm. Capacitive coupling between the memory cells is sufficiently low within this range. The internal resistance of a charge storage electrode is sufficiently low as well. The second conductor 5 serves as second charge storage electrodes (floating gates) 58 and 59.

Figure 18C:
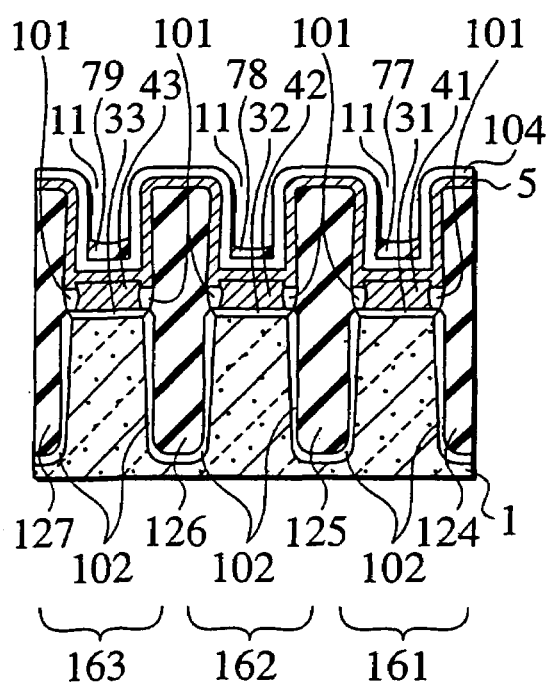
Figure 18D:
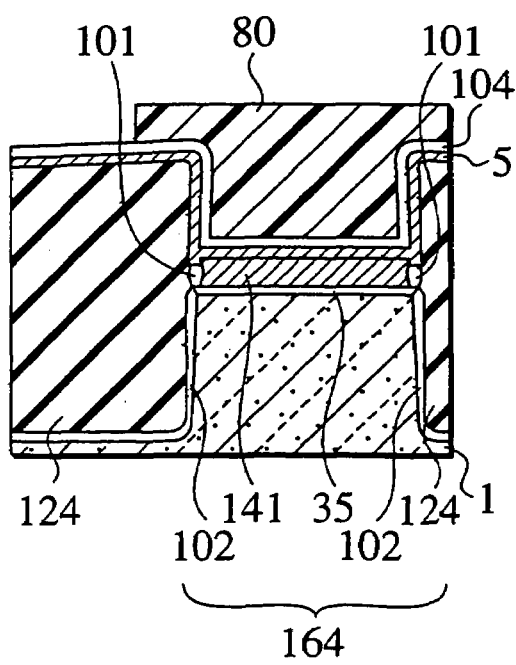

Then, a sidewall mask insulation film 104 is filmy formed on the second conductor 5. As the sidewall mask insulation film 104, there is used a silicon oxide film make of tetraethoxysilane (TEOS) or a High Temperature Oxide (HTO) film. The film thickness of the sidewall mask insulation film 104 is within a range of 3 nm to 100 nm, for example, about 10 nm. A photo resists 77 to 80 are coated. Next, the coated photo resists are partially exposed. Resists on the memory cell 162 and 163 and the dummy cell 161 are exposed, and a resist on the peripheral circuit 164 is not exposed. During this exposure, an exposure is adjusted, whereby, as shown in FIG. 18C and FIG. 18D, resists 77 to 79 remain at the bottom of each of the trench sections 11 of the memory cells 162 and 163 and the dummy cell 161. The active region of the peripheral circuit 164 and its peripheral isolation region 124 are covered with the resist 80. During this exposure, an inexpensive resist with i-line whose wavelength is larger than the pitch of each of the memory cells 162 and 163 and the dummy cell 161 each is used. In this manner, the resists 77 to 79 at the bottom of the trench section 11 of the memory cells 162 and 163 and dummy cell 161 are not exposed. The condition for this exposure is that a resist remains in an active region of the memory cells 162 and 163 and the dummy cell 161 each, and the resists above the isolation regions 124 to 127 of the memory cells 162 and 163 and the dummy cell 161 are exposed.

Figure 19A:
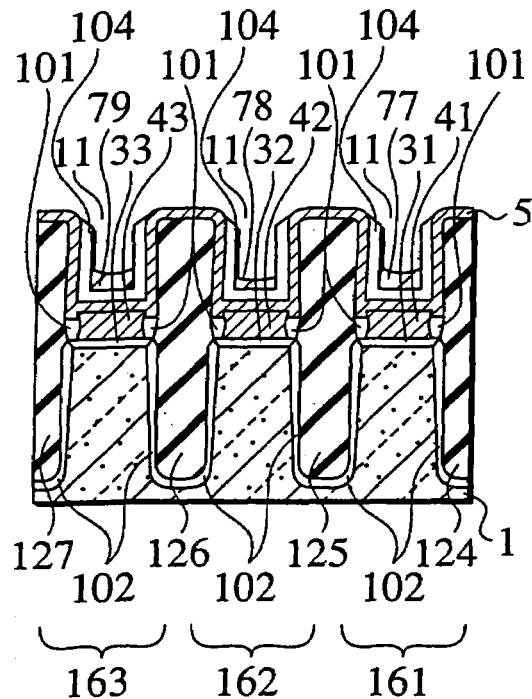
Figure 19B:
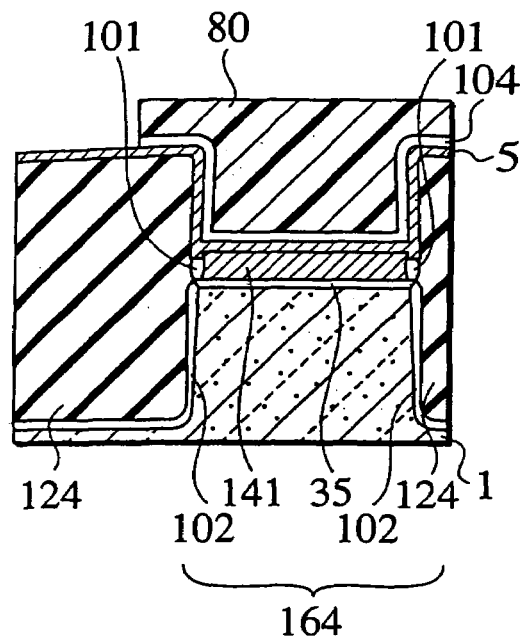

Next, as shown in FIG. 19A and FIG. 19B, while masking the resists 77 to 80, anisotropic etching is carried out. The sidewall mask insulation film 104 is then removed. Here the interval between the opposite inner sidewalls of the second conductor 5 is less further upward of the protrusion 5. Therefore, the insulation film 104 formed on the side wall of the trench section 11 is masked on the second conductor 5 provided on the top face of each of the isolation regions 124 to 127, and remains unetched. The maximum height of the sidewall mask insulation film 104 is determined irrespective of a variation in thickness of the resists 77 to 79. The maximum height of the sidewall mask insulation film 104 is determined depending on the etching depth of anisotropic etching. The maximum height of the sidewall mask insulation film 104 can be formed uniformly and with high controllability.

Figure 19C:
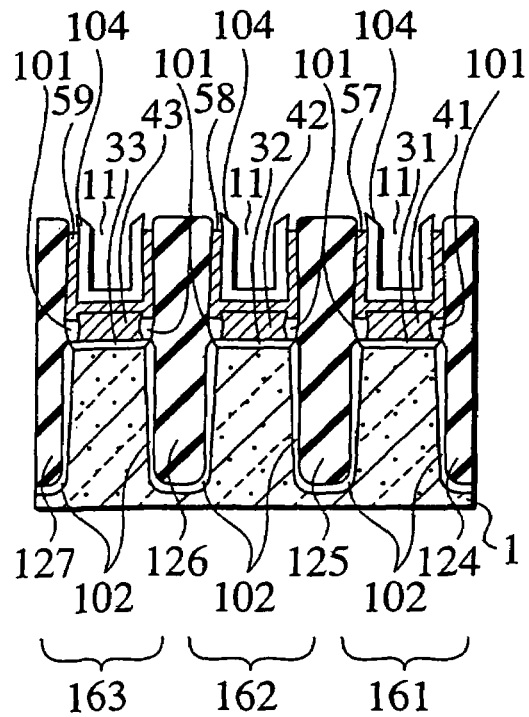
Figure 19D:
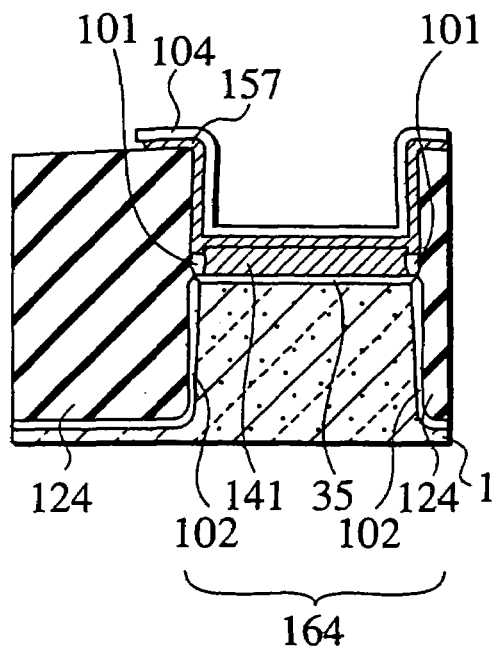

Next, the resists 77 to 80 are removed. While masking the side wall mask insulation film 104, and using the isolation regions 124 to 127 as etching stoppers, as shown in FIG. 19C and FIG. 19D, the second conductor 5 is etched. In this manner, second conductors 57 to 59 and 157 are separated from each other. For this etching, isotropic etching with low etching damage is used. Of course, in the case where such damage is not problematic, anisotropic etching may be carried out while masking the sidewall mask insulation film 104. In anisotropic etching, the etching intrusion length in a transverse direction of the second electric conducting film 157 as shown in FIG. 19D can be reduced. The resists 77 to 80 do not directly contact with the second conductors 57 to 59 and 157. It makes possible to prevent carbon contamination or metal contamination such as sodium (Na), iron (Fe) or chrome (Cr) from the resists 77 to 80 to the second conductor. In addition, the CMP technique is not used for etching of the second conductors 57 to 59 and 157. In this manner, there an over polish phenomenon at a residue caused by a scratch specific to the CMP technique or at a portion at which a large area is produced, does not occur.

Figure 20A:
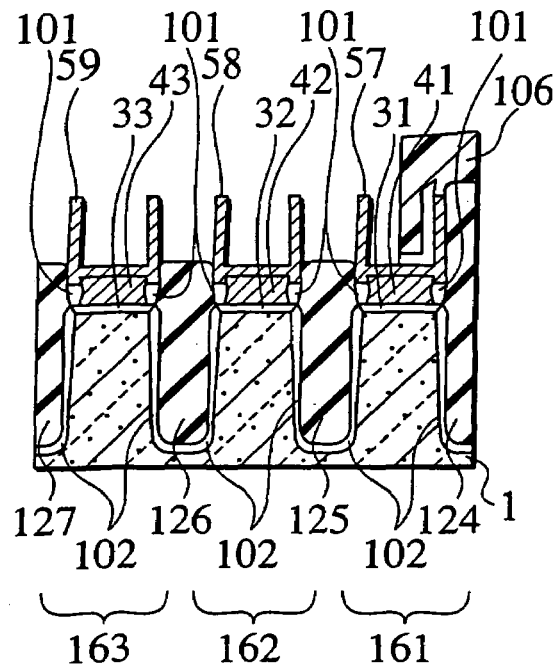
Figure 20B:
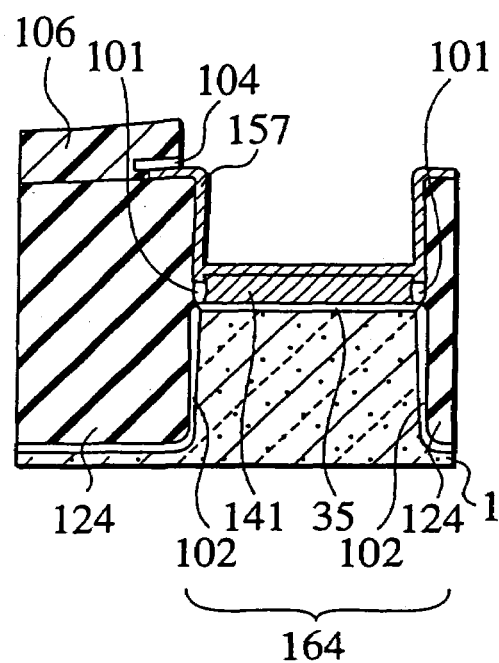

A resist 106 is fully coated. The resist 106 is exposed and patterned so as to cover a part of the dummy cell 161 and the isolation region 124 of the peripheral circuit. In this exposure, a condition is selected such that the bottom of the trench section 11 of the memory cell is also completely exposed. As shown in FIG. 20A and FIG. 20B, while masking the resist 106, the sidewall mask insulation film 104 is removed by isotropic etching, for example. While masking the resist 106, the isolation insulation films 124 to 127 are continuously, etched back by anisotripic etching. The heights of the top face of the isolation regions 124 to 127 are each disposed to be larger than that of each of the first conductors 41 to 43. In addition, the heights of the top face of the isolation regions 124 to 127 are each disposed to be greater than those of the bottom faces of the second conductors 57 to 59 each. That is, the side faces of the isolation regions 124 to 127 each come into contact with those of the second conductors 57 to 59. Further, the resist 106 comes into contact with an end face of each of the second conductors 57 to 59 and 157. Thus, as in FIG. 12A in accordance with the third embodiment, contamination from the resist 106 to the second conductors 57 to 59 and 157 can be suppressed more significantly than by fully applying the resist to the second conductor 5. In addition, a protrusion at the end of the second conductors 57 to 59 each is exposed, but does not fall down. This is because that a large area is provided at the bottom of each of the second conductors 57 to 59.

The resist 106 is removed. The surface of the second conductors 57 to 59 and 157 are each exposed to the air, and thus, a so-called native oxide film grows by 0.3 nm to 2.0 nm. The film thickness of this natural oxide film depends on the time allowed for disposition of the block insulation film 6, which is carried out later. Therefore, the film thickness of this native oxide film was poor uniformity and controllability. In order to obtain a uniform coupling ratio between the floating gate and control gate, it is necessary to remove this native oxide film. Because of this, for example, an etching process using a fluoric acid of this native oxide film is carried out.

Figure 20C:
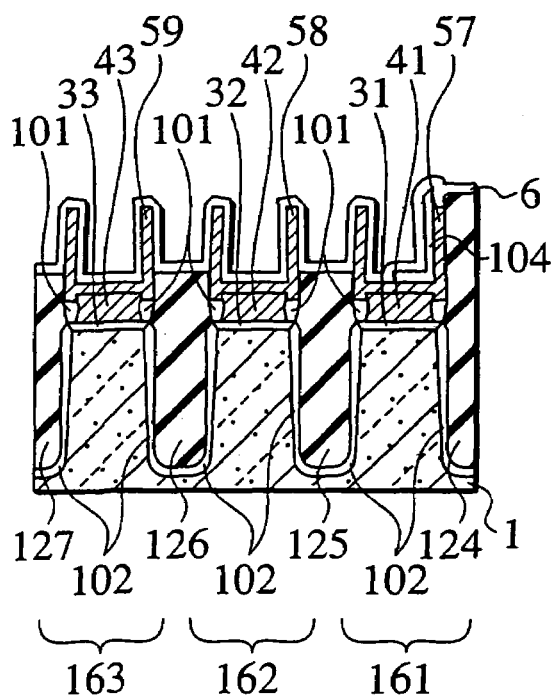
Figure 20D:
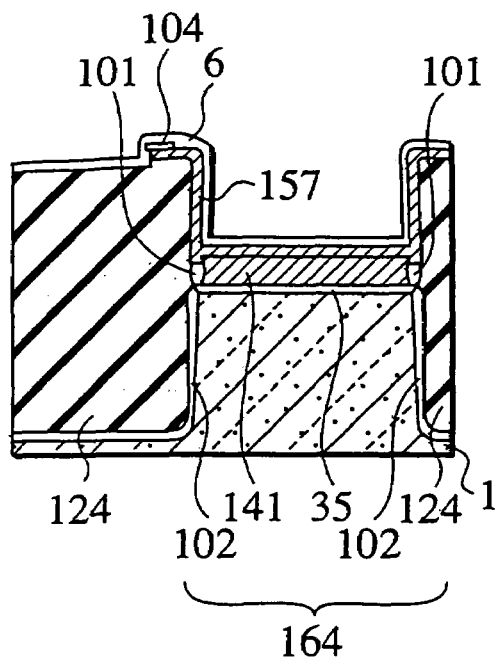

As shown in FIG. 20C and FIG. 20D, the block insulation film 6 is deposited on the surface on which the second conductors 57 to 59 and 157 are exposed and the isolation regions 124 to 127. For the block insulation film 6, for example, a silicon oxide film or oxynitride film with thickness ranging from 5 nm to 30 nm, or alternatively, an ONO film having a laminate structure made of a silicon oxide film, a silicon nitride film, and a silicon oxide film, the film having the respective thickness ranging from 2 nm to 100 nm are used.

Next, a resist is applied, and photolithography and etching are carried out. In this manner, the block insulation film 6 on the peripheral circuit 164 and on the isolation region 124 between the dummy cell 161 and the peripheral circuit 164 are all removed. The control gate electrode 7 is deposited on the block insulation film 6 and the second conductor 157. For the control gate electrode 7, for example, polycrystalline silicon introduced within the range of $10^{17}$ cm$^{-3}$ to $10^{21}$ cm$^{-3}$ in impurity concentration, where phosphor, arsenic, or boron is defined as impurities is used. Alternatively, for the control gate electrode 7, the stack structure may be made of tungsten silicide (WSi) and polycrystalline silicon or a stack structure made of NiSi, MoSi, TiSi, CoSi, and polycrystalline silicon. The film thickness of the control gate electrode is within a range of 10 nm to 500 nm. The film thickness of this control gate electrode is ½ or more of the maximum interval between protrusions at the end of each of the second conductors 57 to 59. In this manner, the insides of each of the second conductors 57 to 59 can be filled in. In addition, the top face of the flattened control gate electrode 7 can be provided over each of the protrusion of the second conductors 57 to 59. Thus ensuring the lithography margin for the control gate electrode 7.

Lastly, as in the manufacturing method in accordance with the second embodiment, the first and second conductors 42, 43, 58, and 59 that are a control gate electrode 7, a block insulation film 6, and a charge storage electrode are processed linearly in anisotripic etching in a pattern provided in the semiconductor surface. The resulting conductors are divided into the control gate electrodes 7, 27, and 28 as shown in FIG. 15A. Here, the protrusion interval of the sides of the second conductors 57 to 59 are each decreased toward the stacked direction. In this manner, the etching residue of the control gate electrode 7 can be decreased while anisotripic etching is carried out during processing of the control gate 7. The source/drain regions 81 to 88 are formed at both sides of the control gate electrodes 7, 27, and 28 each.

Figures 21A, 21B:
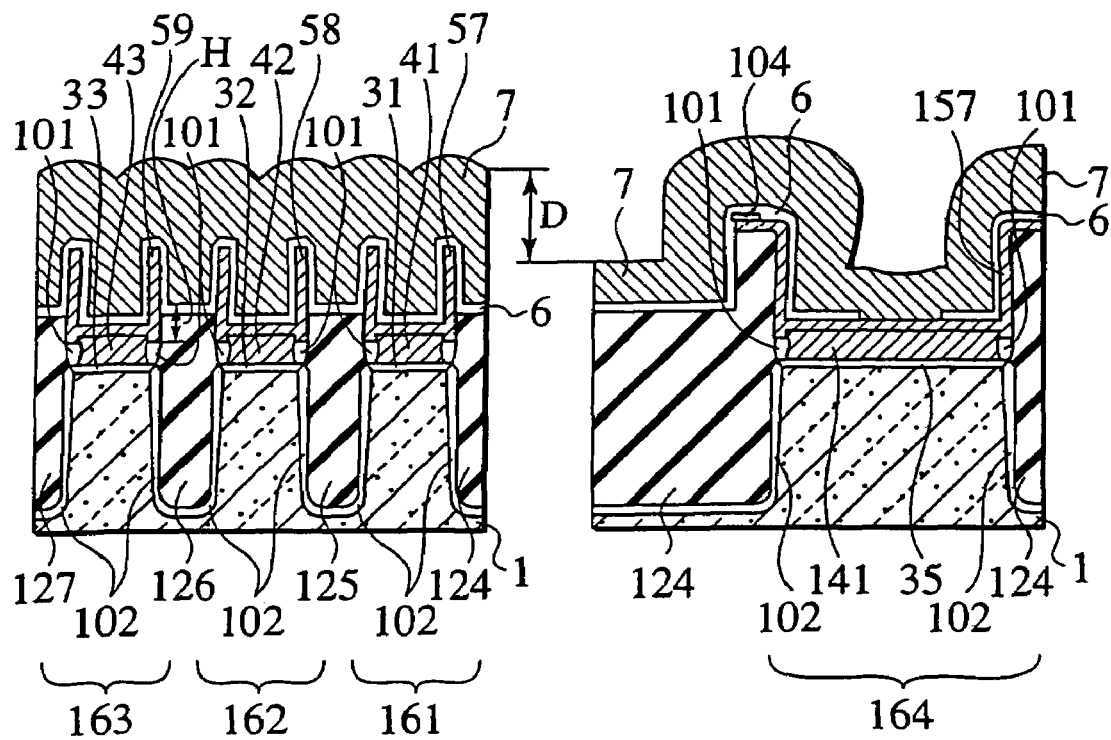
FIG. 21A and FIG. 21B are sectional views each showing a comparative example of the semiconductor device in accordance with the fourth embodiment.
Figure 21C:
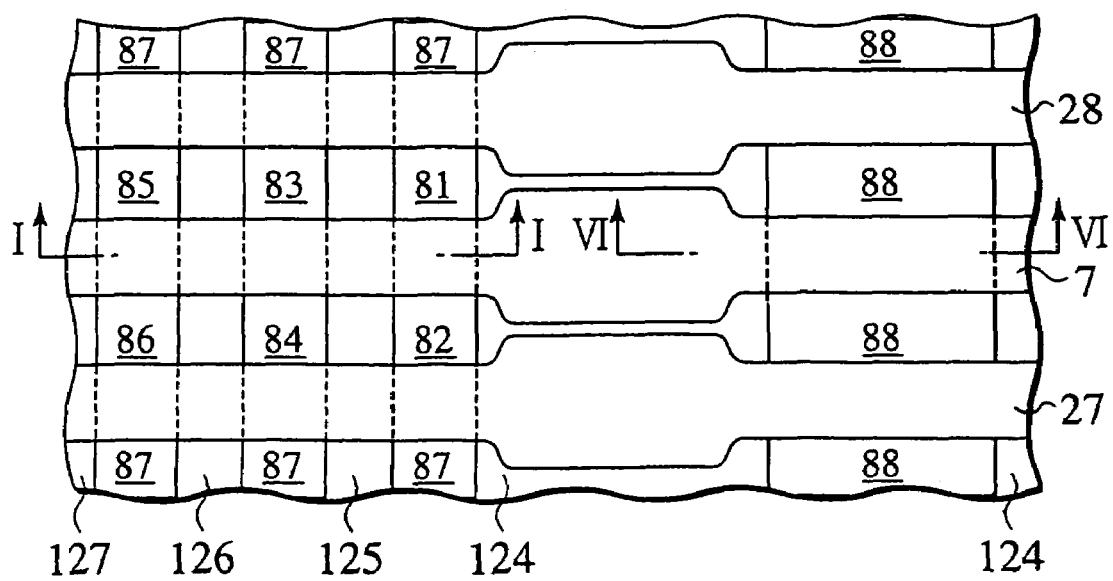
FIG. 21C is a top view showing a comparative example of semiconductor device according to the fourth embodiment.

On the other hand, FIG. 21A, FIG. 21B, and FIG. 21C each show one example of the manufacturing steps compared to the fourth embodiment. These figures each are a sectional view and a top view showing a semiconductor device when a mask etching process using the resist 106 is omitted. If the mask etching using the resist 106 is omitted, the wide isolation region 124 between the peripheral circuit 164 and the dummy cell 161 is etched back. Due to this etching back, the narrow isolation regions 125 to 127 between the memory cells 162 and 163 are also etched back. Thus, the heights of the top faces of the isolation regions 124 to 127 are substantially equal to each other. That is, proper flattening apparently occurs. However, as shown in FIG. 21A and FIG. 21B, if the control gate electrode 7 is deposited, a stepped difference D almost equal to the height of a protrusion at the outer side of the second conductors 57 to 59 each is formed on the top face of the memory cell region and on the top face of the wide isolation region 124 between the dummy cell 161 and the peripheral circuit 164 each. Due to this stepped difference D, as shown in FIG. 21C, the line width of the control gate electrodes 7, 27, and 28 are each increased or narrowed on the wide isolation region 124. The line width of the control gate electrodes 7, 27, and 28 are each increased, whereby short-circuit of the control gate electrodes 7, 27, and 28 may easily occur. Alternatively, due to such a stepped difference D, it was found that a margin for lithography of processing the control gate electrodes 7, 27, and 28 is significantly reduced. Thus, disconnection or short-circuit of the control gate electrodes 7, 27, and 28 may easily occur.

In contrast, in the fourth embodiment, the stepped difference D in lithography of processing the control gate electrodes 7, 27, and 28 is reduced. Thus, as shown in FIG. 20A and FIG. 20B, the height of the top face of the wide isolation region 124 is defined to be larger than that of the top face of the isolation regions 125 to 127 each. In this manner, the stepped difference D can be reduced, thus making it possible to broaden a width of a margin for lithography of processing the control gate electrodes 7, 27, and 28. Thereby, disconnection or short-circuit of the control gate electrodes 7, 27, and 28 hardly occurs.

Modified Example of Fourth Embodiment

A fourth embodiment describes the first modified example of the third embodiment in more detail. The semiconductor device of the modified example of the fourth embodiment is characterized in that the top face of the region between a memory cell region and a peripheral circuit region and the top face of the control gate electrode 7 in the memory cell region form a small step. In addition, the semiconductor device in accordance with a modified example of the fourth embodiment does not produce an etching residue 116 of the control gate electrode 7 shown in FIG. 9. Because of this, in the modified example of the fourth embodiment, as shown in FIG. 22B and FIG. 22C, the second conductors 57 to 59 and 157 are formed only on each of the top faces of the first conductors 41 to 43 and 141. The maximum width of the second conductors 57 to 59 and 157 are each smaller than the width of each of the first conductors 41 to 43 and 141. That is, the maximum distance between two outer side faces of the second conductors 57 to 59 is less than the distance between two end faces of each of the first conductors 41 to 43.

Figure 22A:
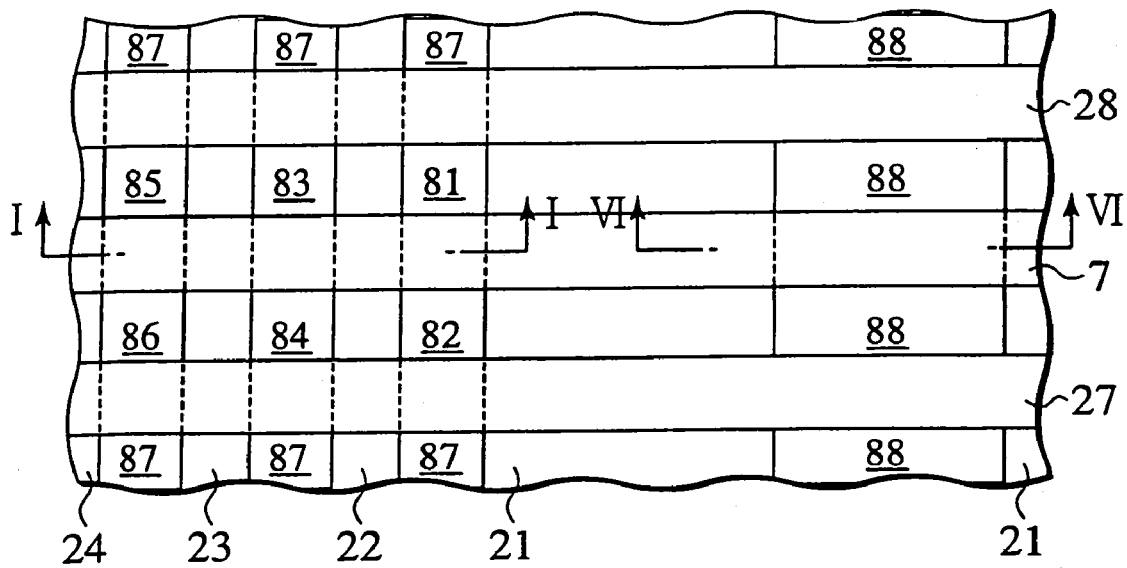
FIG. 22A is an upward perspective view showing a semiconductor device in accordance with a modified example of the fourth embodiment.
Figure 22B:
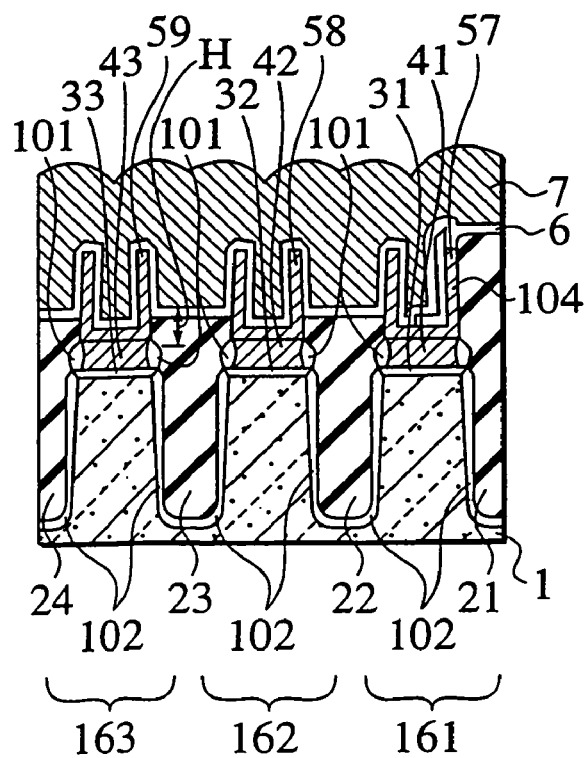
FIG. 22B is a sectional view taken along line I-I in FIG. 22A.
Figure 22C:
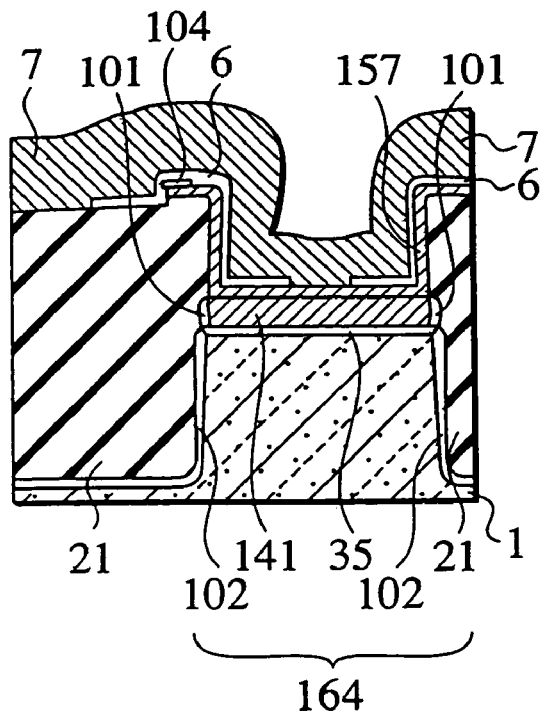
FIG. 22C is a sectional view taken along line VI-VI in FIG. 22A.

A memory cell region is shown at the left of FIG. 22A and in FIG. 22C. A peripheral circuit region is shown at the right of FIG. 22A and in FIG. 22C. The control gates 28, 7, and 27 with their width sequal to each other are disposed in a transverse direction in parallel at equal intervals in the memory cell region. The isolation regions 21 to 24 are disposed in a longitudinal direction downward of the control gates 28, 7, and 27. In the memory cell region, the isolation regions 21 to 24 have widths equal to each other, and are disposed at equal intervals. The source/drain regions 81 to 87 of the memory cells 162 and 163 and the dummy cell 161 are provided in a region in which the isolation regions 21 to 24 are not disposed. A source/drain region 88 of the peripheral circuit 164 is provided in a region in which the control gates 28, 7, and 27 and the isolation region 24 are not disposed.

Gate insulation films 31 to 33 and 35 are provided on the p-type silicon substrate 1. Gate insulation films 31 to 33 and 35 are provided on the p-type silicon substrate 1. The first conductors 41 to 43 and 141 are provided on the gate insulation films 31 to 33 and 35. A floating gate sidewall oxide film 101 is provided on the side face of each of the first conductors 41 to 43 and 141. Second conductors 57 to 59 and 157 are provided on the first conductors 41 to 43 and 141. On the other hand, the second conductors 57 to 59 are not disposed on the floating gate sidewall oxide film 101 and the isolation regions 21 to 24.

The full bottom faces of the second conductors 57 to 59 come into contact with those of the first conductors 41 to 43. That is, the full bottom faces of the second conductors 57 to 59 are covered by the top faces of the first conductors 41 to 43. The second conductors 57 to 59 are integrated as one body. These conductors come into intimate contact with the first conductor over a wider area. Thus, the internal stress of the second conductors 57 to 59 or the peeling-off caused by an external force relevant to the second conductors 57 to 59 can be prevented. It is preferable that the second conductors 58 and 59 are higher at the outer side and lower at the inside, and the lower part of the outer side face of the second conductors 58 and 59 each come into contact with the isolation regions 21 to 24. A floating gate sidewall oxide film 101 comes into contact with isolation insulation films 21 to 24. The block insulation film 6 is provided on both side faces at the outside and inside of each of the second conductors 58 and 59. The block insulation film 6 is provided on the top face inside of the second conductors 58 and 59 each. The control gate 7 is provided on this block insulation film 6. The block insulation film 6 and control gate 7 positioned over the isolation regions 21 to 24 each is formed over the top face (that coincides with the lower face of the second conductors 58 and 59 each) of the first conductors 42 and 43. That is, the height H shown in FIG. 22B is obtained as a positive value. Thus, the etching residue 116 of the control gate 7 described in FIG. 9 does not occur. The block insulation film 6 and control gate 7 positioned over the isolation regions 21 to 24 may be formed over the lower face of the first conductors 42 and 43 each. Thus, the etching residue 116 of the control gate 7 described in FIG. 9 does not occur.

On the silicon substrate 1, the isolation regions 21 to 24 are provided with a liner insulation film 102. On the surface of the silicon substrate 1 on which the isolation regions 21 to 24 are not formed, the gate insulation films 31 to 33 and 35, the first conductors 41 to 43 and 141, and the second conductors 57 to 59 and 157 are provided in a self-aligned manner.

In a modified example of the fourth embodiment, the second conductors 58 and 59 are integrated as one body. Thus, a contact area increases between the first conductors 42, 43 and the second conductors 58, 59. In this manner, the capacitance and a conductance increase between the first conductors 42, 43 and the second conductors 58, 59.

Now, a method of manufacturing a semiconductor device in accordance with a modified example of the fourth embodiment will be described here. In the semiconductor device manufacturing method in accordance with the modified example of the fourth embodiment, a description is given with respect to a method of manufacturing a memory cell region and a peripheral circuit region of the semiconductor device. Part of the manufacturing method in accordance with the fourth embodiment is changed.

Figure 23A:
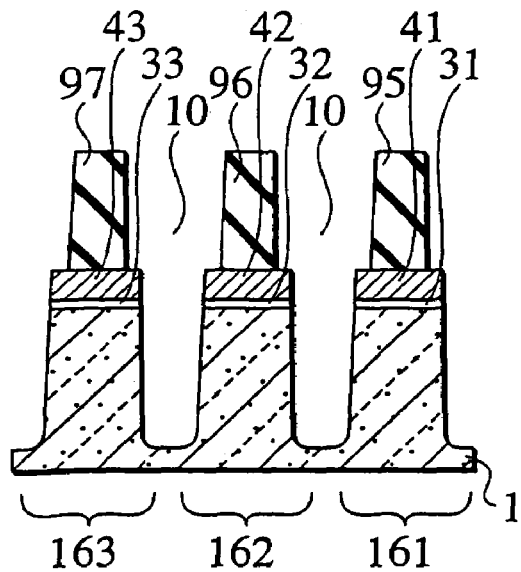
FIG. 23A to FIG. 23D are sectional views each showing a semiconductor device in accordance with a modified example of the fourth embodiment by manufacturing process.
Figure 23B:
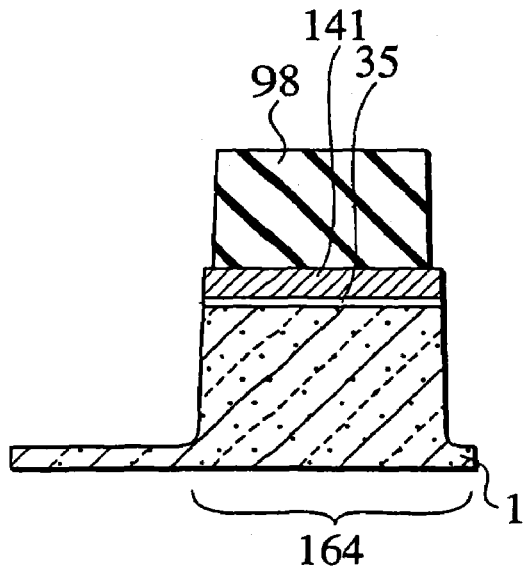

First, the manufacturing method in accordance with the fourth embodiment is executed up until the structure shown in FIG. 16A and FIG. 16B in accordance with the fourth embodiment has been obtained. Next, caps 91 to 94 are etched using a heated phosphate. The caps 91 to 94 are narrowed by a range of 5 nm to 50 nm in thickness. As shown in FIG. 23A and FIG. 23B, slimmed cap materials 95 to 98 can be formed by means of this etching. The thickness to be removed is greater than the sum of the decrement of the first conductors 41 to 43 and 141 when the floating gate sidewall oxide film 101 is formed and the decrement of isolation regions 21 to 24 when a native oxide film of the first conductors 41 to 43 and 141 is removed. Next, a thin liner oxide film 102 is filmy formed on the inner wall of the trench 10. Then, the same steps as those described in the manufacturing method in accordance with the fourth embodiment are executed.

Figure 23C:
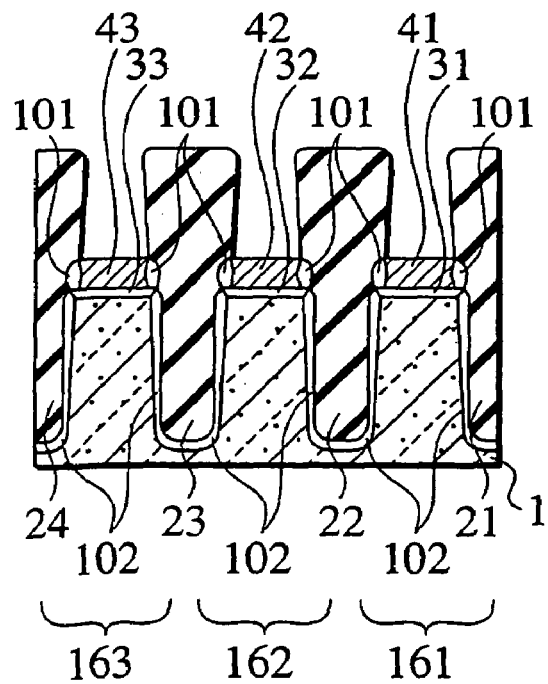
Figure 23D:
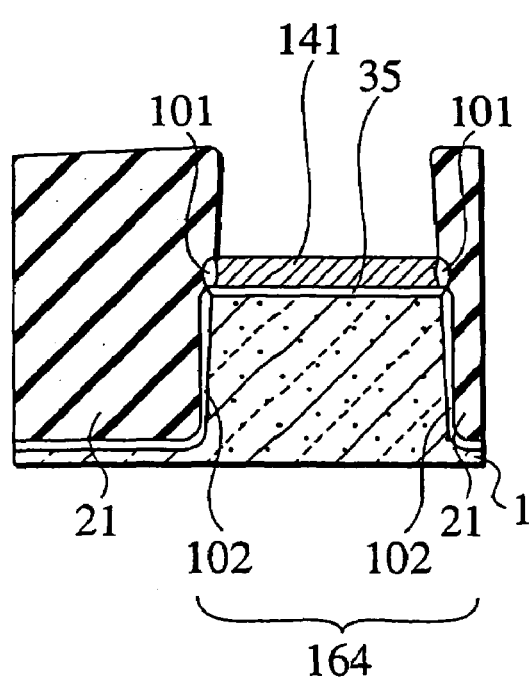

As shown in FIG. 23C and FIG. 23D, immediately after removing the native oxide film of the first conductors 41 to 43 and 141 each and immediately before depositing the second conductor 5, an opening is provided over the top faces of each of the first conductors 41 to 43 and 141. The side faces of each of the first conductors 41 to 43 and 141 are not exposed. Thus, the second conductors 57 to 59 and 157 do not fall down from the side face of the first conductors 41 to 43 and 141 each. In this manner, the control gate electrode 7 is selectively formed on the top face or side face of the second conductor films 57 to 59 and 157 each. On the other hand, the control gate electrode 7 is not disposed downward of the second conducting films 57 to 59 and 157. In addition, the bottom face of the control gate electrode 7 is formed upward in a laminate direction of the bottom face of the first charge storage layer 41. Thus, the etching residue 116 of the control gate electrode 7 does not occur due to masking of the second conductors 57 to 59 and 157.

The present invention is not limited to the above-described embodiments.

The technique of forming an isolation region or an insulation film is not limited to an oxidization or nitriding technique for converting silicon into a silicon oxide film or a silicon nitride film. For example, there may be used: a method of implanting an oxygen ion into deposited silicon; a method of oxidizing the deposited silicon; and a method of transferring the silicon nitride film into the silicon oxide film.

In addition, the semiconductor substrate is not limited to the p-type silicon substrate. The semiconductor substrate may be a monocrystal semiconductor substrate including silicon such as silicon germanium (SiGe) mixed crystal or carbide silicon germanium (SiGeC) mixed crystal. In a case where the p-type silicon is replaced with an n-type silicon substrate, the forming of the n-type MOSFET is replaced with that of the p-type MOSFET. That is, the above-embodied n-type is reread as p-type, and p-type is reread as n-type. Further, arsenic (As) and phosphor (P) of doping impurity species may be reread as either of indium (In) or boron (B).

In addition, the control gate electrode and charge storage region can be made of a silicon semiconductor, silicide or polycide such as SiGe mixed crystal, SiGeC mixed crystal, TiSi, NiSi, CoSi, TaSi, WSi, or MoSi, and a metal such as titanium (Ti), aluminum (Al), Copper (Cu), a titanium nitride (TiN), or tungsten (W). These materials may be poly crystal. Further, the control gate electrode and charge storage region may be laminated with these materials. In addition, amorphous Si, an amorphous SiGe mixed crystal, or an amorphous SiGeC mixed crystal can be used for the control gate electrode and charge storage region, and a laminate structure of these materials may be provided. Further, of course, the present invention is applicable even if the charge storage region is formed in a dotted shape. In addition, various modifications can occur without departing from the spirit of the present invention As has been described above, in accordance with the present invention, there can be provided a semiconductor apparatus capable of reducing an isolation width "Wt" while maintaining a capacity between the floating gate and the control gate.

In addition, in accordance with the present invention, there can be provided a method of manufacturing a semiconductor apparatus in which, even if capacitance coupling between a floating gate and the control gate is increased, a capacitance between the floating gates is hardly increased, and electrical interference between cells can be prevented.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
   a semiconductor substrate including plural trenches on a surface;
   first and second insulators placed in the trenches, respectively, and top faces of the first and second insulators are higher than the surface of the substrate, the second insulator is larger in width than the first insulator, and the top face of the second insulator is higher than that of the first insulator, and the first and the second insulators being first and second insulation films, respectively, having the same material;
   a third insulation film disposed on the surface of the substrate;
   a first conductor disposed over a surface of the third insulation film;
   a top face at an outer side of the first conductor is higher than a top face at an inner side of the first conductor,
   a fourth insulation film contacting with the top face of the first conductor; and
   a second conductor disposed on the first and the second insulation film via the fourth insulation film.

2. The semiconductor device as claimed in claim 1, wherein a first outer side face of the first conductor contacts with the first insulator, and a second outer side face of the first conductor contacts with the first insulation film.

3. The semiconductor device as claimed in claim 1, wherein the first insulator and the second insulator are disposed in a longitudinal direction in parallel with each other, and a plurality of the second conductors are disposed in a transverse direction in parallel with one another.

4. The semiconductor device as claimed in claim 1, wherein a bottom face of the second conductor disposed over the first insulator is higher than a top face of the first conductor.

5. The semiconductor device as claimed in claim 1, wherein the second insulator is provided between a memory cell array that consists of a plurality of a memory cell and a periphery circuit.

6. The semiconductor device as claimed in claim 5, wherein a dummy cell is formed adjacent to the memory cell.

7. A semiconductor device comprising:
   a semiconductor substrate including plural trenches on a surface;
   first and second insulators placed in the trenches, respectively, and top faces of the first and second insulators are higher than the surface of the substrate, the second insulator is larger in width than the first insulator, and the top face of the second insulator is higher than that of the first insulator, and the first and the second insulators being first and second insulation films, respectively, having the same material;
   a third insulation film disposed on the surface of the substrate;

a first conductor disposed over a surface of the third insulation film;

a fourth insulation film contacting with the top face of the first conductor; and a second conductor disposed on the first and the second insulation film via the fourth insulation film, wherein an interval between a first side face and a second side face of the first conductor is upwardly smaller.

8. The semiconductor device as claimed in claim 7, wherein the first side face of the first conductor contacts with the second insulator, and the second side face of the first conductor contacts with the first insulation film.

9. The semiconductor device as claimed in claim 7, wherein the first insulator and the second insulator are disposed in a longitudinal direction in parallel with each other, and a plurality of the second conductors are disposed in a transverse direction in parallel with one another.

10. The semiconductor device as claimed in claim 7, wherein a bottom face of the second conductor disposed over the first insulator is higher than a top face of the first conductor.

11. The semiconductor device as claimed in claim 7, wherein the second insulator is provided between a memory cell array that consists of a plurality of a memory cell and a periphery circuit.

12. The semiconductor device as claimed in claim 11, wherein a dummy cell is formed adjacent to the memory cell.

13. A semiconductor device comprising:

a semiconductor substrate including plural trenches on a surface;

first and second insulators placed in the trenches, respectively, and top faces of the first and second insulators are higher than the surface of the substrate, the second insulator is larger in width than the first insulator, and the top face of the second insulator is higher than that of the first insulator, and the first and the second insulators being first and second insulation films, respectively, having the same material;

a third insulation film disposed on the surface of the substrate;

a first conductor disposed over a surface of the third insulation film;

a fourth insulation film contacting with the top face of the first conductor; and a second conductor disposed on the first and the second insulation film via the fourth insulation film, wherein a first side face of the first conductor contacts with the second insulator, and a second side face of the first conductor contacts with the first insulator, and a maximum interval between the first side face and the second side face of the first conductor is larger than a width of the surface of the substrate.

14. The semiconductor device as claimed in claim 13, wherein the first insulator and the second insulator are disposed in a longitudinal direction in parallel with each other, and a plurality of the second conductors are disposed in a transverse direction in parallel with one another.

15. The semiconductor device as claimed in claim 13, wherein a bottom face of the second conductor disposed over the first insulator is higher than a top face of the first conductor.

16. The semiconductor device as claimed in claim 13, wherein the second insulator is provided between a memory cell array that consists of a plurality of a memory cell and a periphery circuit.

17. The semiconductor device as claimed in claim 16, wherein a dummy cell is formed adjacent to the memory cell.

* * * * *